US011211955B2

(12) United States Patent
Choi et al.

(10) Patent No.: US 11,211,955 B2
(45) Date of Patent: Dec. 28, 2021

(54) VOLTAGE PROTECTION CIRCUIT TO PREVENT POWER AMPLIFIER BURNOUT, AND ELECTRONIC DEVICE HAVING THE SAME

(71) Applicant: Samsung Electronics Co., Ltd., Gyeonggi-do (KR)

(72) Inventors: Hyunseok Choi, Gyeonggi-do (KR); Jooseung Kim, Gyeonggi-do (KR); Namjun Cho, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 85 days.

(21) Appl. No.: 16/832,495

(22) Filed: Mar. 27, 2020

(65) Prior Publication Data
US 2020/0313703 A1 Oct. 1, 2020

(30) Foreign Application Priority Data

Mar. 29, 2019 (KR) .......................... 10-2019-0036993

(51) Int. Cl.
*H04B 1/04* (2006.01)
*H03F 3/24* (2006.01)

(52) U.S. Cl.
CPC .............. *H04B 1/04* (2013.01); *H03F 3/245* (2013.01); *H03F 2200/294* (2013.01); *H03F 2200/451* (2013.01); *H04B 2001/0408* (2013.01)

(58) Field of Classification Search
CPC ........ H03F 2200/451; H03F 3/24; H03F 1/52; H03F 2200/411; H03F 1/02;
(Continued)

(56) References Cited

U.S. PATENT DOCUMENTS 8,432,224 B1 * 4/2013 Woo ...................... H03F 1/0227
330/285
10,090,811 B2 * 10/2018 Ripley ................. H04B 1/3827
455/127.5
(Continued)

FOREIGN PATENT DOCUMENTS

EP 1696558 A1 * 8/2006 ............... H03F 3/19
KR 10-0813909 3/2008
(Continued)

OTHER PUBLICATIONS

Chen, W., Lin, W., Huang, S. A novel VSWR-protected and controllable CMOS class E power amplifier for bluetooth applications, 2011, International Journal of Design, Analysis and Tools for Integrated Circuits and Systems, vol. 1(1), pp. 22-26; https://dialog.proquest.com/professional/docview/1 (Year: 2011).*

(Continued)

*Primary Examiner* — Lana N Le
(74) *Attorney, Agent, or Firm* — The Farrell Law Firm, P.C.

(57) ABSTRACT

Disclosed is a voltage protection circuit for preventing power amplifier burnout in an electronic device. The electronic device includes a power amplifier (PA) configured to amplify a transmission signal, a switch configured to set a path of a signal outputted from the PA, a bias control circuit configured to control the supply of a bias current driving the PA, and a voltage protection circuit configured to provide a main control signal for turning off the PA earlier than turning off the switch based on a battery voltage providing a driving power of the electronic device, and forward the main control signal to the bias control circuit, wherein, in response to receiving the main control signal instructing to turn off the PA from the voltage protection circuit, the bias control unit stops the supply of the bias current driving the PA.

20 Claims, 21 Drawing Sheets

(58) Field of Classification Search
CPC .... H03F 2200/444; H03F 3/72; H03F 1/0211;
H03F 2200/18; H03F 2200/426; H03F
2200/471; H03F 1/30; H03F 1/305; H03F
2200/15; H03F 2200/513; H03F
2200/3206; H03F 2203/21127; H03F
2200/129; H03F 2201/3215; H03F 3/245;
H03F 2200/294; H03F 1/56; H03F 3/211;
H04B 1/40; H04B 2001/0408; H04B
2001/0433; H04B 1/04; H04B 1/3827;
H04B 1/3888; H04B 1/18; H04B 1/44;
H04B 1/50; H03G 3/3042; H03G 3/004;
H03G 1/0029; H03G 3/30; H02H 3/243;
H02H 3/202
See application file for complete search history.

(56) References Cited

U.S. PATENT DOCUMENTS

| | | | |
|---|---|---|---|
| 10,401,399 B2 | 9/2019 | Chen et al. | |
| 10,691,189 B2 | 6/2020 | Su et al. | |
| 10,755,750 B2 | 8/2020 | Rowley | |
| 10,852,756 B2 | 12/2020 | Luria et al. | |
| 2001/0041548 A1* | 11/2001 | Bult | H03F 3/45188 |
| | | | 455/252.1 |
| 2004/0198301 A1* | 10/2004 | Rozenblit | H03G 3/3042 |
| | | | 455/343.1 |
| 2008/0211585 A1* | 9/2008 | Karoui | H03F 3/19 |
| | | | 330/298 |
| 2009/0309663 A1* | 12/2009 | Griffiths | H03F 1/52 |
| | | | 330/296 |
| 2010/0120475 A1 | 5/2010 | Taniuchi et al. | |
| 2011/0128076 A1* | 6/2011 | Mills | H03F 1/52 |
| | | | 330/207 P |
| 2013/0113570 A1 | 5/2013 | Yin et al. | |
| 2015/0270806 A1* | 9/2015 | Wagh | H03F 1/3247 |
| | | | 330/296 |
| 2016/0099688 A1 | 4/2016 | Quaglietta et al. | |
| 2016/0261239 A1 | 9/2016 | Khesbak et al. | |
| 2018/0013392 A1 | 1/2018 | Han et al. | |
| 2018/0145708 A1* | 5/2018 | Jo | H04B 1/50 |
| | | | 455/127.5 |
| 2019/0036494 A1* | 1/2019 | Ng | H03F 3/245 |

FOREIGN PATENT DOCUMENTS

| | | | | |
|---|---|---|---|---|
| KR | 1020170019710 | | 2/2017 | |
| WO | WO-2006111186 A1 * | 10/2006 | | H03F 3/19 |

OTHER PUBLICATIONS

International Search Report dated Jul. 17, 2020 issued in counterpart application No. PCT/KR2020/004234, 8 pages.

* cited by examiner

VOLTAGE PROTECTION CIRCUIT TO PREVENT POWER AMPLIFIER BURNOUT, AND ELECTRONIC DEVICE HAVING THE SAME

CROSS-REFERENCE TO RELATED APPLICATION(S)

This application is based on and claims priority under 35 U.S.C. § 119 to Korean Patent Application No. 10-2019-0036993, filed on Mar. 29, 2019, in the Korean Intellectual Property Office, the disclosure of which is incorporated herein by reference in its entirety.

BACKGROUND

1. Field

The disclosure relates generally to an electronic device, and more particularly, to a voltage protection circuit for preventing power amplifier burnout, and an electronic device having the same.

2. Description of Related Art

With the gradual development of smart phones, a support of various modules and functions of the smart phones is in demand. As modules and functions such as a large capacity files, downloads, multi windows, large screens, dual speakers and multi cameras have been added to fifth generation (5G) smart phones, capable batteries have been required to provide sufficient current for the functions. For instance, a maximum allowable current of conventional smart phones may be sufficient at about 4 amperes (A), but a maximum allowable current of 5G smart phones can be increased to 6 A.

When a maximum allowable current is increased in this manner, a voltage drop can occur due to an internal battery resistance and a resistance of a power management integrated circuit (PMIC) and a printed circuit board (PCB). This can result in the unstable power supply of a power amplifier (PA) existing in a radio frequency front module (RFFE) of a smart phone. As a result, the unstable power supply can cause burnout of the PA.

When current provided by a battery is increased instantaneously or temporarily, a voltage drop can occur due to an internal resistance of the battery. Thus, while other modules receiving a stable voltage from the PMIC operate normally, a PA and a switch receiving a power source directly from the battery can be in an OFF state instantaneously or temporarily. When this occurs, or when switching from the OFF state to an ON state, there is a possibility of the burnout of the PA, if a sequence is not suitable.

As such, there is a need in the art for an apparatus that can handle higher current without causing burnout of the PA in an electronic device.

SUMMARY

Aspects of the disclosure are to address at least the above-mentioned problems and/or disadvantages and to provide at least the advantages described below. Accordingly, an aspect of the disclosure is to provide a voltage protection circuit capable of decreasing the likelihood of the burnout of a PA caused by a voltage drop of a battery voltage, by introducing a circuit that turns OFF the PA before a switch is turned OFF, in response to a voltage range provided by the battery being deviated from a normal operation, and an electronic device using the same.

In accordance with an aspect of the disclosure, an electronic device includes a PA configured to amplify a transmission signal, a switch configured to set a path of a signal outputted from the PA, a bias control circuit configured to control the supply of a bias current driving the PA, and a voltage protection circuit configured to provide a main control signal for turning off the PA earlier than turning off the switch based on a battery voltage providing a driving power of the electronic device, and forward the main control signal to the bias control circuit, wherein, in response to receiving the main control signal instructing to turn off the PA from the voltage protection circuit, the bias control unit stops the supply of the bias current driving the PA.

In accordance with another aspect of the disclosure, an electronic device includes a plurality of antennas, a first plurality of phase converters configured to convert a phase of a transmitted signal for transmitted signal beamforming, a plurality of PAs configured to amplify the transmitted signal, a plurality of low noise amplifiers (LNAs) configured to amplify a received signal, a second plurality of phase converters configured to convert a phase of a received signal, a plurality of switches configured to selectively connect the plurality of PAs or the plurality of LNAs with the plurality of antennas, a bias control circuit configured to control the supply of a bias current driving the PA, and a voltage protection circuit configured to provide a main control signal turning off the plurality of PAs earlier than turning off the plurality of switches in response to abnormality occurring in a battery voltage providing a driving power of the electronic device, and to forward the main control signal to the bias control circuit, wherein the bias control circuit stops the supply of a bias current driving the plurality of PAs in response to receiving the main control signal instructing to turn off the plurality of PAs from the voltage protection circuit.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

Figure 1:
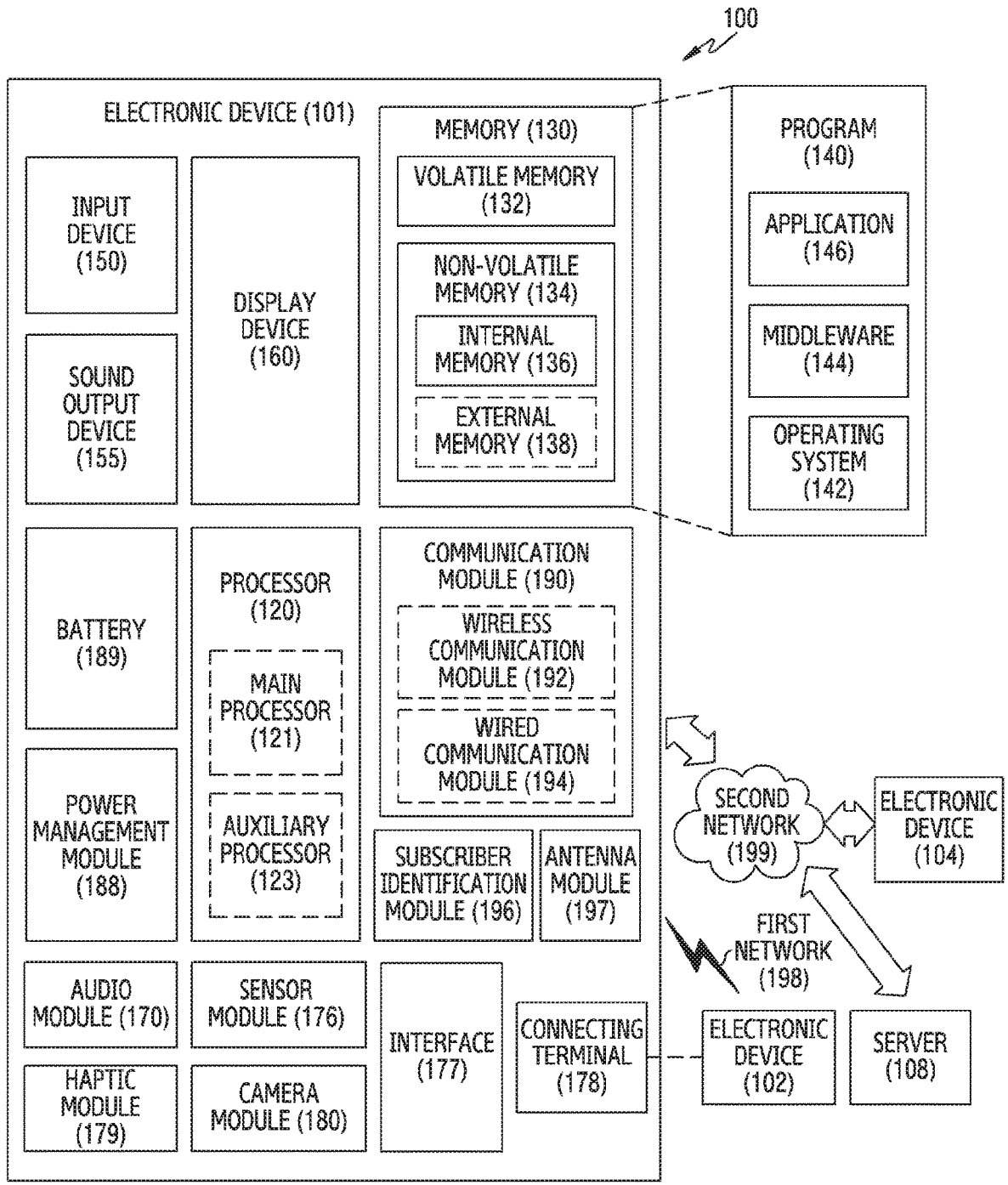
FIG. 1 is a block diagram of an electronic device within a network environment according to an embodiment.

Embodiments are described below in detail with reference to the accompanying drawings. In the disclosure, a related detailed description is set forth, but this is not intended to limit the embodiments of the disclosure. Descriptions of well-known functions and constructions are omitted for the sake of clarity and conciseness.

The electronic device herein may be one of various types of electronic devices, such as a portable communication device (e.g., a smartphone), a computer device, a portable multimedia device, a portable medical device, a camera, a wearable device, or a home appliance. However, the electronic devices are not limited to these devices.

It should be appreciated that embodiments of the disclosure and the terms used herein are not intended to limit the technological features set forth herein to particular embodiments and include various changes, equivalents, or replacements for a corresponding embodiment. In the description of the drawings, similar reference numerals may be used to refer to similar or related elements.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and do not limit the components in importance or order. It is to be understood that if an element, such as a first element, is referred to, with or without the term "operatively" or "communicatively", as "coupled with," "coupled to," "connected with," or "connected to" another element, such as a second element), this indicates that the first element may be coupled with the second element directly (e.g., wiredly), wirelessly, or via a third element.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one of the components may be omitted from the electronic device 101, or one or more other components may be added in the electronic device 101. Some of the components may be implemented as single integrated circuitry. For example, the sensor module 176 may be implemented as embedded in the display device 160.

The processor 120 may execute a program 140 to control at least one other hardware or software component of the electronic device 101 coupled with the processor 120, and may perform various data processing or computation. As at least part of the data processing or computation, the processor 120 may load a command or data received from the sensor module 176 or the communication module 190 in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a function. The auxiliary processor 123 may be implemented as separate from, or as part of the main processor 121.

The auxiliary processor 123 may control at least some of functions or states related to at least one component among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component of the electronic device 101. The various data may include the program 140 and input data or output data for a command related thereto. The memory 130 may include the volatile memory 132 or the non-volatile memory 134.

The program 140 may be stored in the memory 130 as software and may include an operating system (OS) 142, middleware 144, or an application 146.

The input device 150 may receive a command or data to be used by the processor 120 of the electronic device 101, from the outside (e.g., a user) of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for incoming calls. The receiver may be implemented as separate from, or as part of the speaker.

The display device 160 may visually provide information to the user of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device 102 directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device 102 directly (e.g., wiredly) or wirelessly. The interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device 102. The connecting terminal 178 may include an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his or her tactile or kinesthetic sensation. The haptic module 179 may include a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of a PMIC.

The battery 189 may supply power to at least one component of the electronic device 101. The battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM card 196.

The antenna module 197 may transmit or receive a signal or power to or from the external electronic device of the electronic device 101. The antenna module 197 may include an antenna including a radiating element composed of a conductive material or a conductive pattern formed in or on a substrate (e.g., the PCB). The antenna module 197 may include a plurality of antennas. In such a case, at least one antenna appropriate for a communication scheme used in the communication network, such as the first network 198 or the second network 199, may be selected by the communication module 190 from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate commands or data therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud, distributed, or client-server computing technology may be used, for example.

In the electronic device 101 of FIG. 1, the communication module 190 may include various hardware components for performing communication.

FIGS. 2A, 2B, 2C and 2D illustrate a communication module in an electronic device according to embodiments.

Figure 2A:
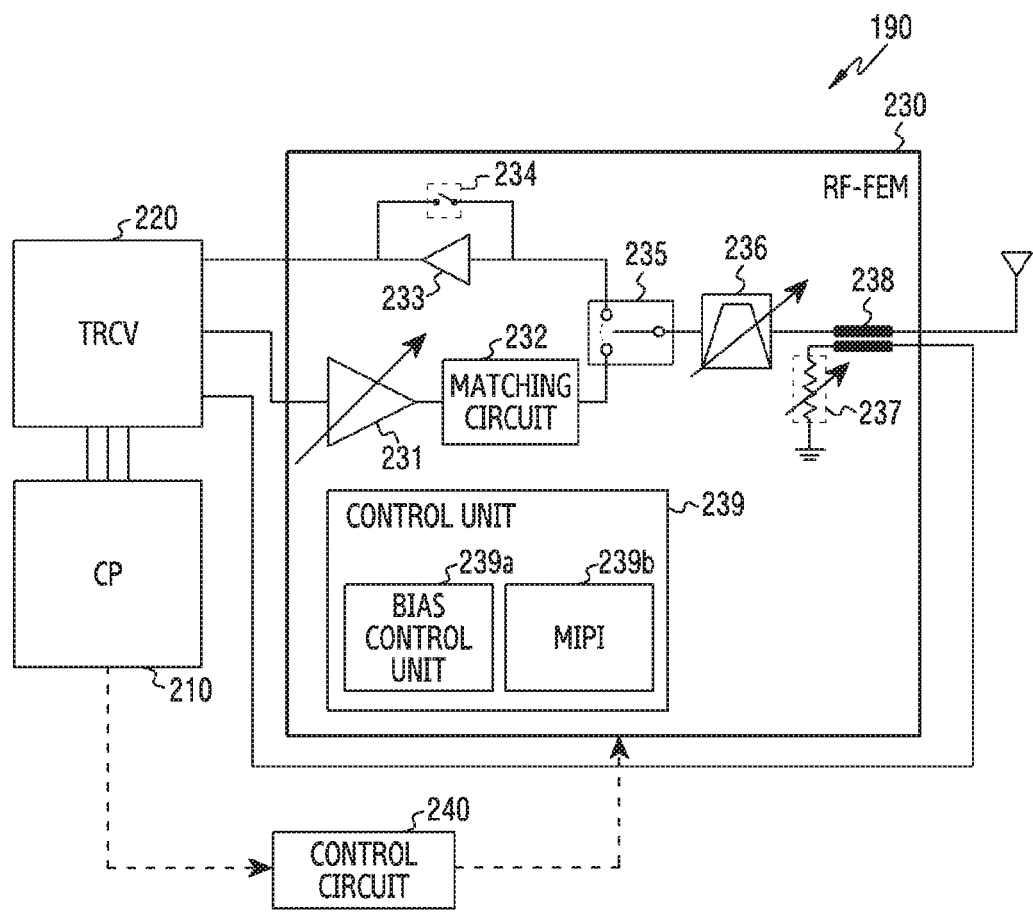
FIGS. 2A, 2B, 2C and 2D illustrate a communication module in an electronic device according to embodiments.
Figure 2B:
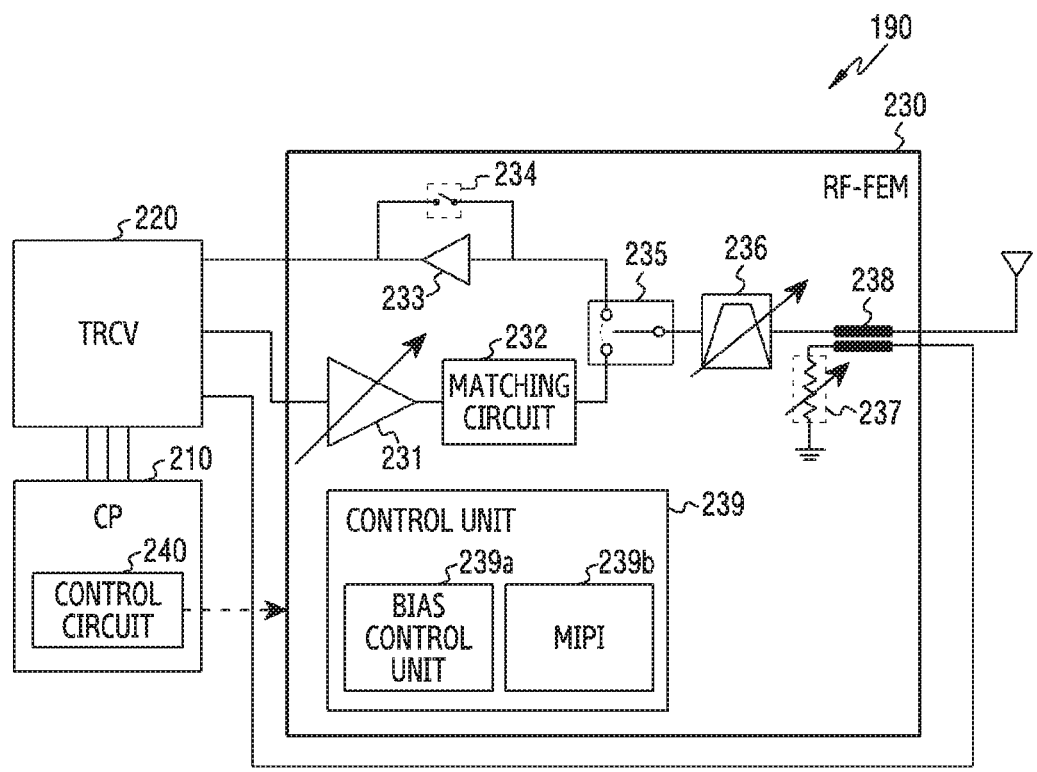
Figure 2C:
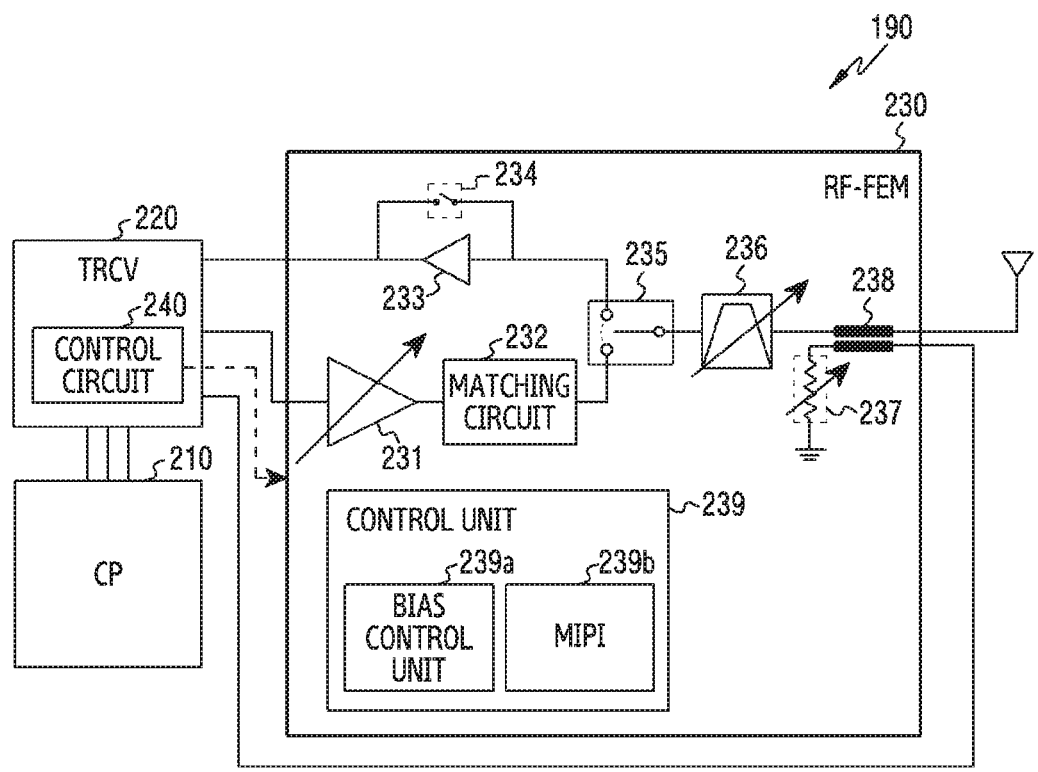
Figure 2D:
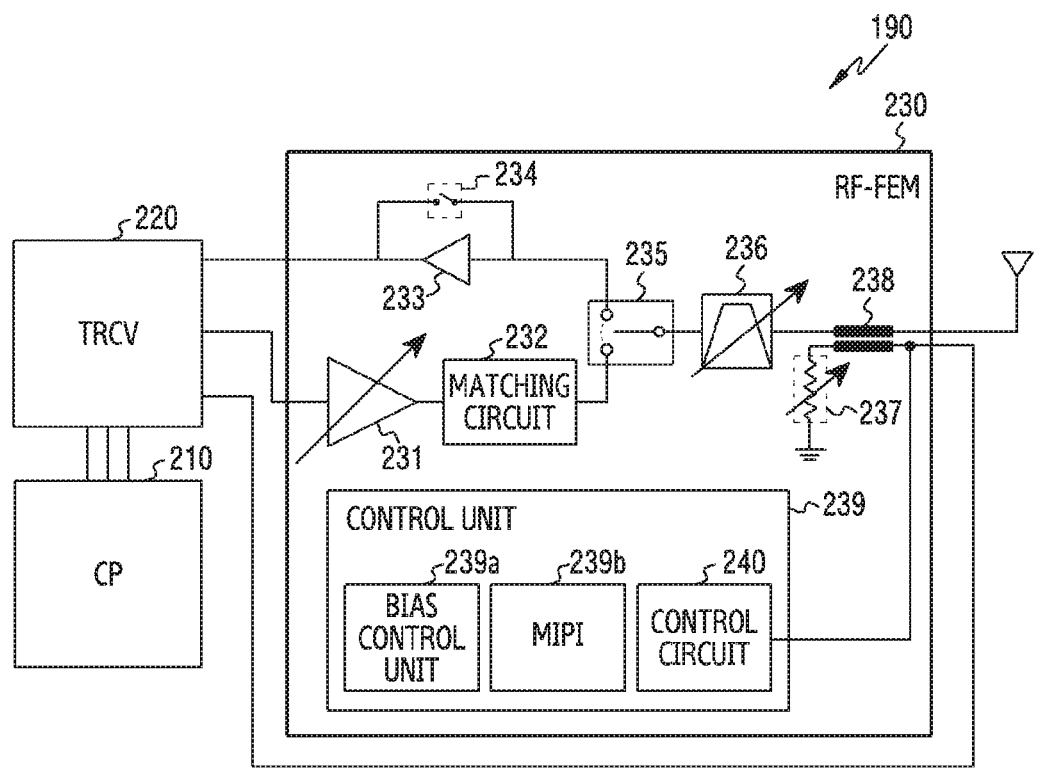

Referring to FIG. 2A, the communication module 190 may include a communication processor (CP) 210, a transceiver (TRCV) 220, an RF-FEM 230, and/or a control circuit 240.

The CP 210 may perform control for communication and processing of a digital signal. The CP 210 may control an operation or state of the transceiver 220 and/or the-RF-FEM 230. For example, the CP 210 may determine operations or states of the transceiver 220, the RF-FEM 230, and/or components included in the transceiver 220 or the RF-FEM 230 and provide an instruction for controlling the operations or states. The CP 210 may include a protocol stack for performing operations within layers defined in the communication standard. For example, the CP 210 may provide and interpret a message according to a form defined in the standard based on which the CP 210 may interact with a network. The CP 210 may process a digital/baseband signal. For example, the CP 210 may perform channel encoding/decoding and modulation/demodulation.

The transceiver 220 may perform processing for transmitting or receiving a signal. The transceiver 220 may perform frequency band conversion and/or amplification of a signal. For example, the transceiver 220 may process an analog/intermediate (IF) or RF signal. For example, the transceiver 220 may include a digital to analog converter (DAC)/an analog to digital converter (ADC), a mixer, and/or an oscillator.

The RF-FEM 230 may process an RF signal. The RF-FEM 230 may include a PA 231, a matching circuit 232, a low noise amplifier (LNA) 233, a bypass switch 234, a transmission/reception switch 235, a filter 236, a variable resistor 237, a coupler 238 and/or a control unit 239. The PA 231 may amplify an RF signal provided from the transceiver 220. The matching circuit 232 may form load impedance. The LNA 233 may amplify a received signal. The bypass switch 234 may be used to form a reception path which does not use the LNA 233. The transmission/reception switch 235 may, at signal transmission, connect a path including the PA 231 with the filter 236, and may, at signal reception, connect a path including the LNA 233 with the filter 236. In accordance with a frequency band of a signal used for communication, the filter 236 may filter the signal. The variable resistor 237 may provide a resistance value necessary for an operation of the coupler 238. The coupler 238 may couple a transmitted signal.

The control unit 239 may provide a control signal for controlling at least one component included in the RF-FEM 230. The control unit 239 may include a bias control unit 239a controlling a bias current of the PA 231, and/or a MIPI 239b for signal exchange with at least one component included in the RF-FEM 230.

The control circuit 240 may control at least one component included in the RF-FEM 230. In response to the determination of the CP 210, the control circuit 240 may control at least one component included in the RF-FEM 230. For example, the control circuit 240 may control to tune a state of at least one of the PA 231, the matching circuit 232 or the filter 236 based on an accessed network or a used power mode. For example, the control circuit 240 may measure the performance or characteristic (e.g., linearity or efficiency) of the RF-FEM 230 while the RF-FEM 230 is installed in and managed in the electronic device 101. For example, the control circuit 240 may measure the performance or characteristic of the RF-FEM 230 by using a signal coupled by the coupler 238. The control circuit 240 may referred to as a control block, a sensing circuit, a sensing and control block, a sensing and control circuit or other terms having a technological meaning equivalent to these.

In FIG. 2A, the control circuit 240 has been described as a component separate from the CP 210, the transceiver 220 or the RF-FEM 230. In other embodiments, the control circuit 240 may be included in any one of the CP 210, the transceiver 220 or the RF-FEM 230. For example, the control circuit 240 may be included in the CP 210 as in FIG. 2B, the transceiver 220 as in FIG. 2C, or the control unit 239 of the RF-FEM 230 as in FIG. 2D.

In FIGS. 2A, 2B, 2C and 2D, the RF-FEM 230 may include the PA 231 for amplifying a transmitted signal. The RF-FEM 230 may further include at least one another amplifier, such as a pre-driver amplifier and/or a DA. In this case, an inter stage matching circuit may be further included between the pre-driver amplifier and the DA or between the DA and the PA 231. In another embodiment, the RF-FEM 230 may further include an input matching circuit.

In FIGS. 2A, 2B, 2C and 2D, a matching circuit (e.g., the input matching circuit, the inter stage matching circuit or the matching circuit 232) and/or the filter 246 are controlled, thereby being capable of tuning the characteristic (e.g., linearity or efficiency) of the RF-FEM 230, or tuning a power amplitude of a transmitted signal.

Figure 3A:
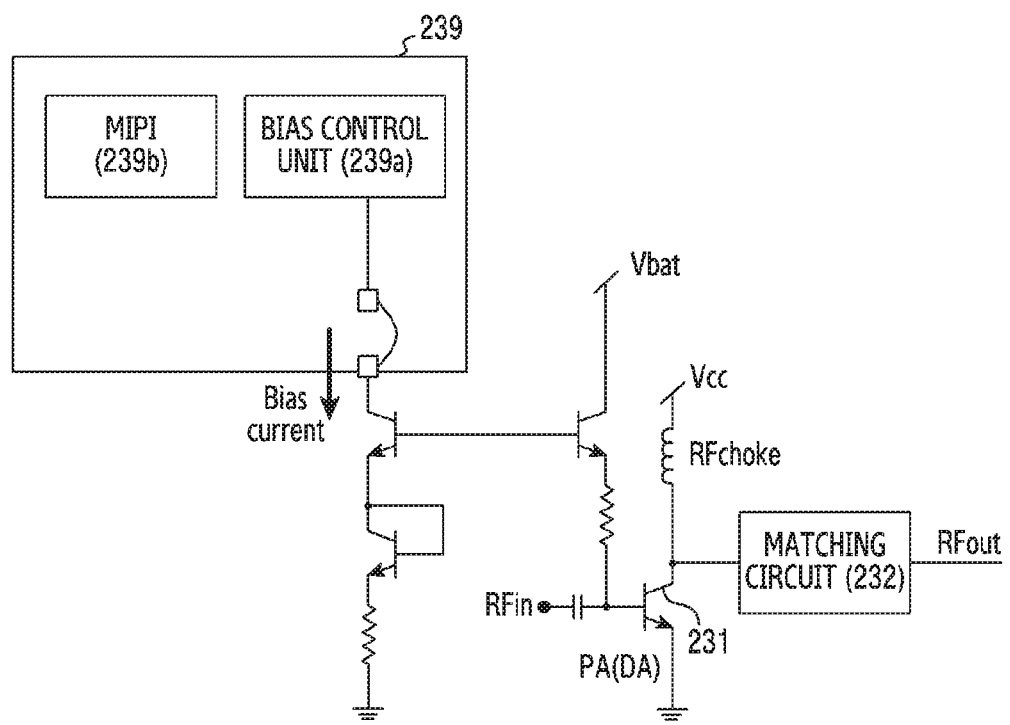
FIG. 3A and FIG. 3B illustrate a radio frequency-front end module (RF-FEM) which includes a bias control unit providing a bias current to a PA or driver amplifier (DA) as a part of a communication module of an electronic device according to embodiments.
Figure 3B:
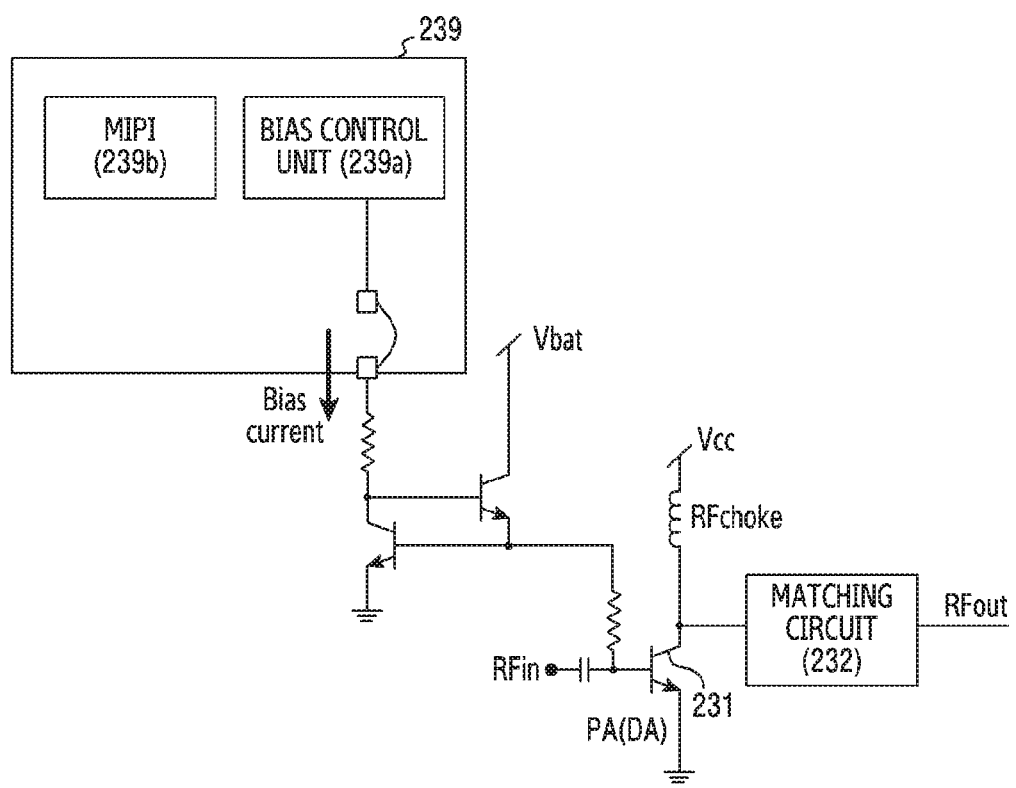

FIG. 3A and FIG. 3B illustrate an RF-FEM which includes the bias control unit 239a providing a bias current to the PA 231 or DA as a part of a communication module of an electronic device according to embodiments.

A structure of the PA and DA shown in FIG. 3A and FIG. 3B is merely an example.

Referring to FIG. 3A and FIG. 3B, in response to a bias current being provided by the bias control unit 239a of the control unit 239, transistors of the PA 231 and/or DA are turned ON and thus, an input signal (RFin) passes through the matching circuit 232 and an output signal (RFout) is outputted. On the other hand, in response to the bias current not being provided by the bias control unit 239a, the transistors within the PA 231 and/or DA are turned OFF and thus, the input signal (RFin) is not forwarded and the output signal (RFout) is not outputted.

Figure 3C:
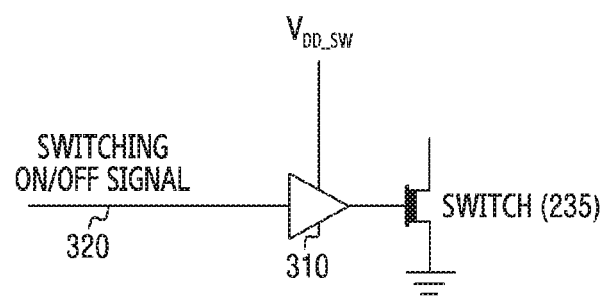
FIG. 3C illustrates a switch of a communication module in an electronic device according to an embodiment.

FIG. 3C illustrates the switch 235 of a communication module in an electronic device according to an embodiment.

The switch 235 illustrated in FIGS. 2A, 2B, 2C and 2D may, at signal transmission, connect a path including the PA 231 with the filter 236, and may, at signal reception, connect a path including the LNA 233 with the filter 236. Referring to FIG. 3C, the switch 235 may be controlled by a switching ON/OFF control signal 320 passing through the buffer 310 for the sake of path connection. As a driving voltage ($V_{DD\_SW}$) of the buffer 310, a battery voltage (Vbat) passing through a regulator may be applied. Why the regulator is used is that the driving voltage (e.g., 1.8V) of the buffer 310 and the battery voltage (e.g., 3.7V) may be mutually different. In response to the battery voltage (Vbat) being higher or lower than a driving voltage range of the regulator, the regulator is not able to provide the driving voltage of the buffer 310 and, as a result, the buffer 310 may not operate. Thus, the switch 235 cannot be controlled and may be in an OFF or abnormal state.

Figure 4:
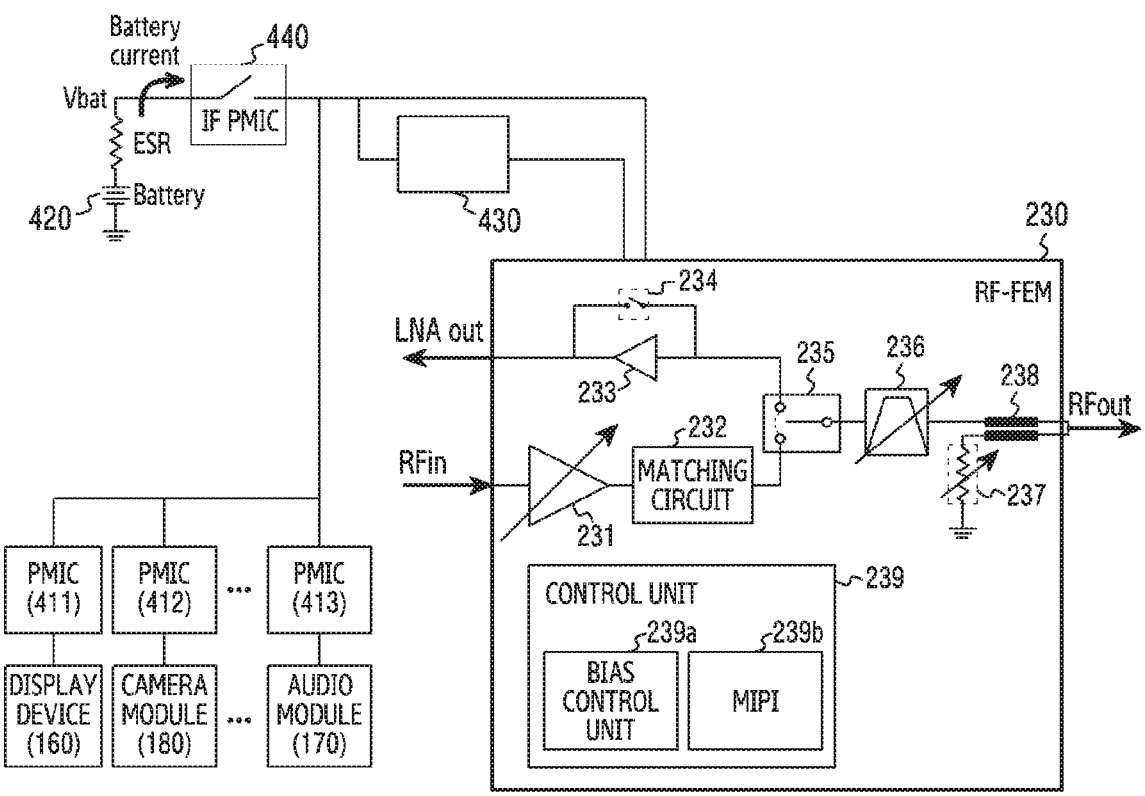
FIG. 4 illustrates an example of using a battery power source in an electronic device according to an embodiment.

FIG. 4 illustrates an example of using a battery power source in an electronic device according to an embodiment.

Referring to FIG. 4, a battery 420 may supply a current necessary for driving each module within the electronic device 101. A current of the battery 420 may be supplied to each module through a PMIC 440 that is in a front stage of the battery 420 and manages the entire power of the electronic device 101. In another example, each module within the electronic device 101 may receive a current through separate PMICs 411, 412 and 413 for the sake of a stable supply of a power source. The PA 231 or switch 235 of the RF-FEM 230 may receive power directly from the battery 420 without a separate PMIC. Commonly, the RF-FEM 230 needs to provide a high output requiring a sufficient bias current to the PA 231. When passing through the PMIC, the RF-FEM 230 cannot provide sufficient bias current to provide a high output. Thus, the RF-FEM 230 needs to connect directly to the battery 420 without the PMIC.

A voltage (Vcc) supplied to the PA 231 may be supplied via an envelope tracking integrated circuit (ETIC) or an envelope tracking modulator (ETM) 430. The ETM is a device capable of varying the voltage (Vcc) supplied to the PA 231 according to an envelope of a transmitted RF signal. By this, the electronic device 101 may reduce transmitted power consumption.

As illustrated in FIG. 1 and FIG. 4, the electronic device 101 includes a plurality of modules. In a maximum load scenario in which these modules simultaneously operate, as much as a maximum allowable current (e.g., 6 A) may be used instantaneously (e.g., a few milliseconds (ms)) or during a predetermined period (e.g., a few seconds). In this case, a voltage drop can occur due to an internal resistance (ESR) of the battery, the PMIC, and a total resistance of a PCB line for power supply.

Figure 5:
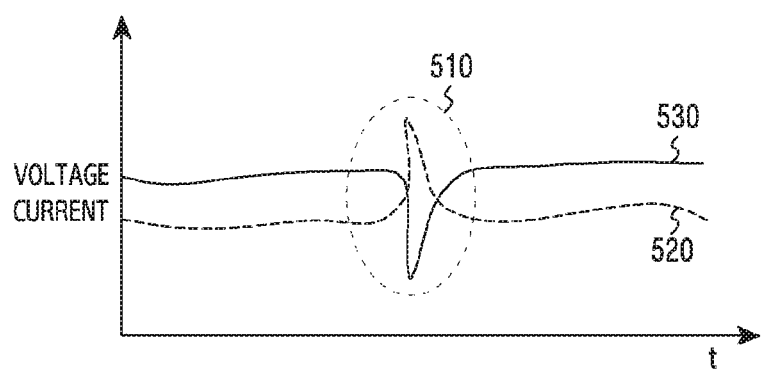
FIG. 5 illustrates an example of a voltage drop resulting from an instantaneous current increase to which the disclosure is applied.

FIG. 5 illustrates an example of a voltage drop resulting from an instantaneous current increase to which the disclosure is applied.

Referring to FIG. 5, when a current 520 is increased in a region 510 instantaneously, there may be a sudden drop of a voltage 530. In response to it being assumed that a power source supplied from a battery is ranged from 4 V to 3.7 V, and an instantaneous voltage drop of 1.13 V occurring, a voltage (Vbat) supplied to the RF-FEM 230 may drop to a range of 3 V to 2.5 V or less. In this case, a module receiving a power source via an individual PMIC may operate normally, but elements such as the PA 231 and the switch 235 within the RF-FEM 230 module receiving a power source from the battery 420 without an individual PMIC may not operate, in that a supplied voltage is deviated from a voltage range capable of operating the element and instantaneously turns OFF. The transceiver 220 providing an RF signal (RFin) inputted to the PA 231 normally operates and continuously forwards the RF signal, whereas the PA 231 and the switch 235 may be switched from an ON state to an OFF state or from the OFF state to the ON state. In response to a sequence of switching the PA 231 and the switch 235 into the OFF state or a sequence of switching the same into the ON state not being suitable, there is a possibility in which the PA 231 burns out.

Figure 6A:
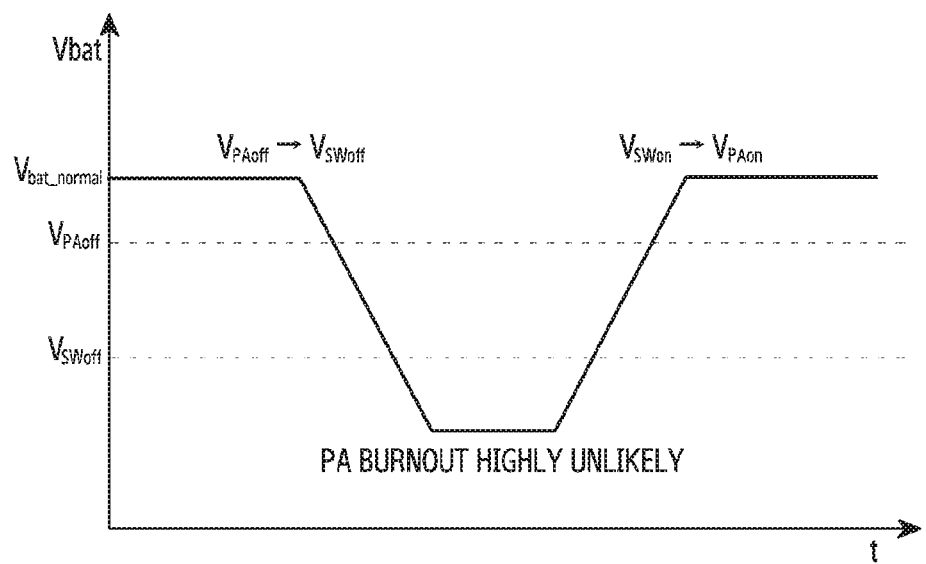
FIGS. 6A and 6B illustrate a possibility of burnout resulting from a sequence of ON or OFF switching of a PA and a switch dependent on a voltage drop to which the disclosure is applied.
Figure 6B:
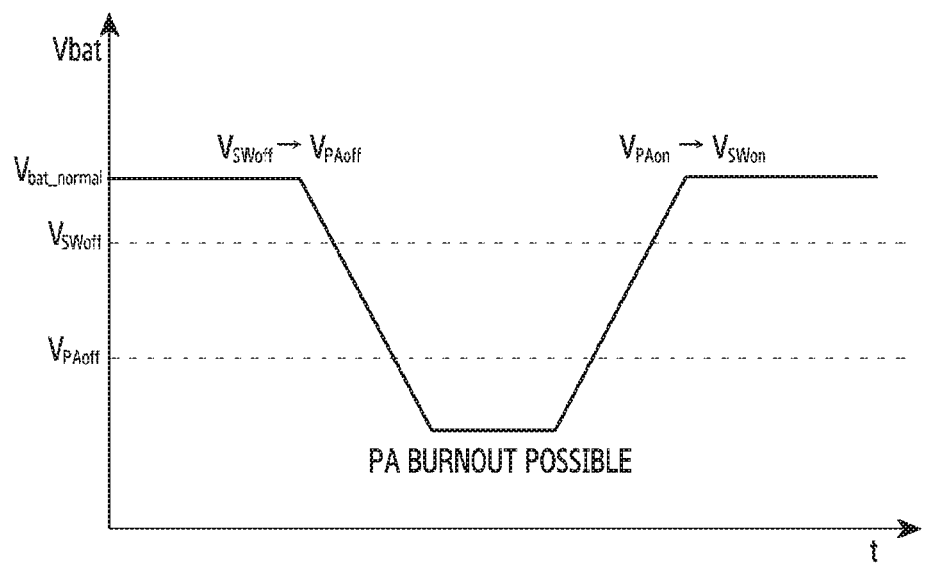

FIGS. 6A and 6B illustrate a possibility of burnout resulting from a sequence of ON or OFF switching of a PA and a switch dependent on a voltage drop, to which the disclosure is applied.

Referring to FIG. 6A, in response to the PA 231 turning OFF first and the switch 235 turning OFF later according to a battery voltage drop, or the switch 235 turning ON first and the PA 231 turning ON later according to the recovery of the voltage drop, it is highly unlikely for there to be burnout of the PA 231. In contrast, as in FIG. 6B, in response to the switch 235 turning OFF first and the PA 231 turning OFF later according to a battery voltage drop, or the PA 231 turning ON first and the switch 235 turning ON later according to the recovery of the voltage drop, there is an increased possibility of burnout of the PA 231. In FIG. 6B, in response to an RF signal inputted from the transceiver 220 being amplified in the PA 231 and then proceeding to the switch 235 that is in an OFF state, the signal proceeds to a high impedance side by the switch 235. Thus, the amplified signal may be fully reflected to the PA 231. In this case, the reflected signal is inputted to an output stage of the PA 231, which may cause the PA 231 to burn out.

As described above, there is a need to turn OFF the PA 231 earlier than the switch 235 in order to prevent the burnout of the PA 231, in response to an under voltage or an over voltage being supplied to the RF-FEM 230.

The electronic device herein may include a voltage protection circuit for turning OFF the PA 231 earlier than the switch 235 in order to render highly unlikely the above-described burnout possibility.

Figure 7:
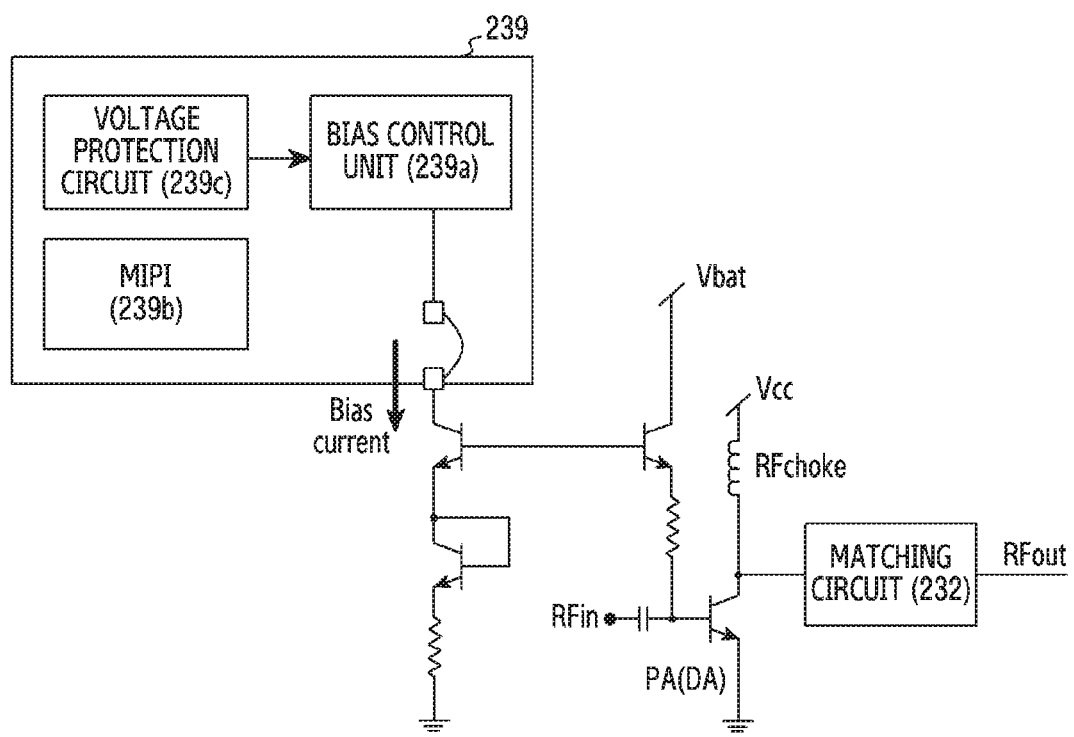
FIG. 7 illustrates an RF-FEM which includes a bias control unit providing a bias current to a PA or DA, and a voltage protection circuit, as a part of a communication module of an electronic device according to an embodiment.

FIG. 7 illustrates an RF-FEM which includes the bias control unit 239a providing a bias current to the PA 231 or DA, and the voltage protection circuit 239c, as a part of a communication module of an electronic device according to an embodiment.

FIG. 7 illustrates adding the voltage protection circuit 239c based on the example of FIG. 3A but may be identically applied even to the example of FIG. 3B. Also, while it is illustrated that the voltage protection circuit 239c is constructed separately from the bias control unit 239a, the voltage protection circuit 239c may be constructed in combination with another circuit (e.g., the bias control unit 239a) of the control unit 239.

Referring to FIG. 7, the control unit 239 may further include the voltage protection circuit 239c. By transmitting a signal turning OFF the PA 231 to the bias control unit 239a before the switch 235 is switched into an OFF state due to the abnormality of the driving voltage ($V_{DD\_SW}$) of the buffer 310 through which the signal 320 controlling the switch 235 passes, the voltage protection circuit 239c may prevent burnout of the PA 231.

Figure 8:
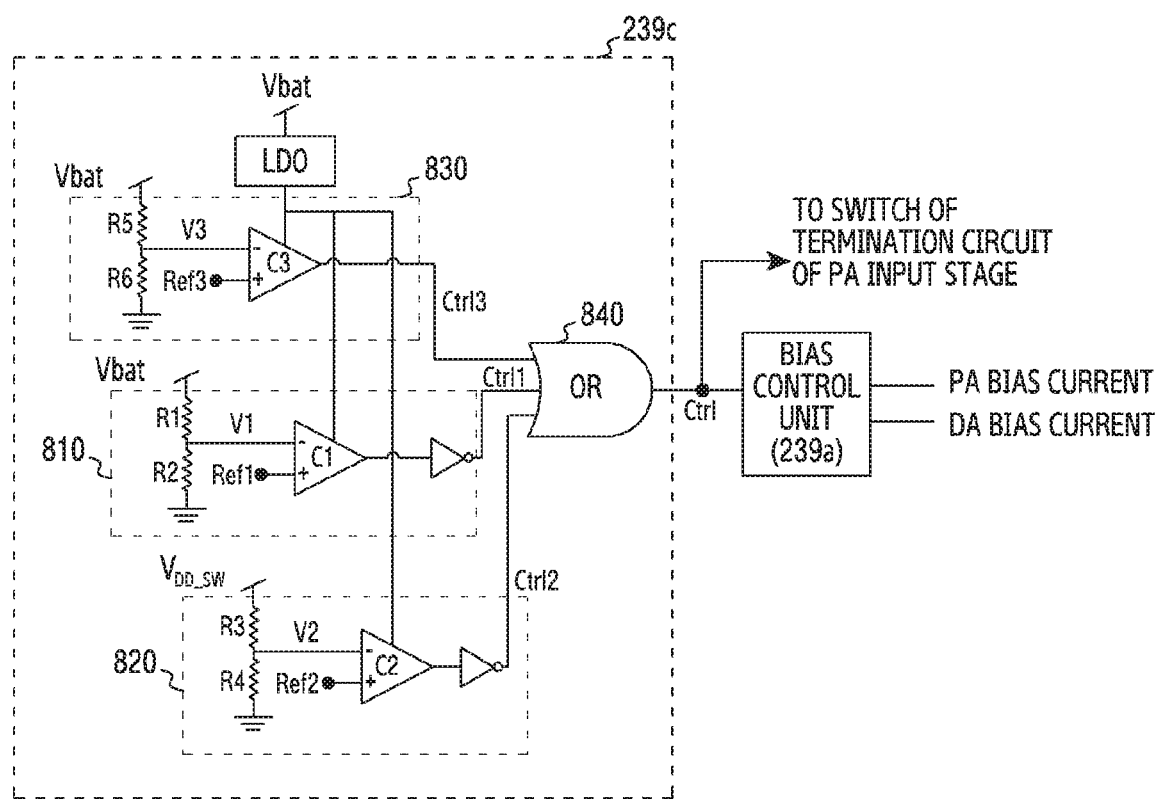
FIG. 8 illustrates a voltage protection circuit according to an embodiment.

FIG. 8 illustrates the voltage protection circuit 239c according to an embodiment.

Referring to FIG. 8, it is illustrated that the voltage protection circuit 239c includes two under voltage obtaining units 810 and 820 and an over voltage obtaining unit 830, but the disclosure not limited to this, and the voltage protection circuit 239c may include fewer or more obtaining units according to a type of a set voltage being sought.

The under voltage obtaining unit 810 may monitor a battery voltage (Vbat) and distinguish a state in which the battery voltage (Vbat) decreases to less than a predetermined voltage (I.e., the set voltage). The under voltage obtaining unit 810 may include resistors (R1 and R2) and/or a comparator (C1) for monitoring the battery voltage (Vbat). The resistors (R1 and R2) may divide the battery voltage (Vbat), to provide a voltage based on Equation (1), as follows:

$$\left(V1 = \frac{R1}{R1+R2}Vbat\right) \quad (1)$$

The comparator (C1) may compare the provided voltage (V1) and a reference voltage (Ref1). In response to the provided voltage (V1) being less than the reference voltage (Ref1), the comparator (C1) may provide a control signal (Ctrl1) for preventing a bias current. The under voltage obtaining unit 810 may further include an inverter performing a logic 'NOT' additionally connected to an output stage of the comparator (C1). The reference voltage (Ref1) may be set as a value capable of providing a signal for preventing a bias current before the switch 235 enters an OFF state due to a decrease of the driving voltage applied to the buffer 310 controlling the switch 235.

To provide the signal for preventing the bias current in response to the battery voltage (Vbat) decreasing to below 2.5 V, the resistor (R1) may have a value of 100 ohms, and the resistor (R2) may have a value of 900 ohms, and the reference voltage (Ref1) may be 0.25 V. The divided voltage (V1) provided by the resistors (R1 and R2) decreases to 0.1 Vbat, and in response to decreasing to below the reference voltage (Ref1) set to 0.25 V, the battery voltage (Vbat) decreases to less than 2.5 V, and the comparator (C1) obtaining this decreased voltage may provide a control signal (Ctrl1) (additionally with an inverter). In response to the divided voltage (V1) being less than the reference voltage (Ref1), the control signal (Ctrl1) turns ON and in response to the divided voltage (V1) being greater than the reference voltage (Ref1), the control signal (Ctrl1) turns OFF. Thus, the control signal is provided based on whether to supply a bias current to the PA 231 or to the bias control unit 239a.

Similarly, the under voltage obtaining unit 820 may monitor the driving voltage ($V_{DD\_SW}$) of the buffer 310 controlling the switch 235, and distinguish a state in which the driving voltage ($V_{DD\_SW}$) decreases to below a predetermined voltage. The under voltage obtaining unit 820 may include resistors (R3 and R4) and/or a comparator (C2) for monitoring the buffer driving voltage ($V_{DD\_SW}$). The resistors (R3 and R4) may divide the driving voltage ($V_{DD\_SW}$), to provide a voltage based on Equation (2), as follows:

$$\left(V2 = \frac{R3}{R3 + R4} V_{DD\_SW}\right) \quad (2)$$

The comparator (C2) may compare the provided voltage (V2) and a reference voltage (Ref2). In response to the provided voltage (V2) being less than the reference voltage (Ref2), the comparator (C2) may provide a control signal (Ctrl2) for preventing a bias current. The under voltage obtaining unit 820 may further include an inverter performing a logic 'NOT' additionally connected to an output stage of the comparator (C2). The reference voltage (Ref2) may be set as a value capable of providing a signal for preventing a bias current before the switch 235 enters an OFF state due to a decrease of the driving voltage applied to the buffer 310 controlling the switch 235.

To provide the signal for preventing the bias current in response to the driving voltage ($V_{DD\_SW}$) decreasing to below 1.2 V, the resistor (R3) may have a value of 100 ohms, and the resistor (R4) may have a value of 400 ohms, and the reference voltage (Ref2) may be 0.24 V. Then, a divided voltage (V2) provided by the resistors (R3 and R4) decreases to 0.2 $V_{DD\_SW}$, and in response to this voltage (V2) decreasing to less than the reference voltage (Ref2) set to 0.24 V, the driving voltage ($V_{DD\_SW}$) decreases to less than 1.2V, and the comparator (C2) obtaining this voltage may provide the control signal (Ctrl2) (additionally with an inverter). In response to the divided voltage (V2) being less than the reference voltage (Ref2), the control signal (Ctrl2) turns ON and in response to the divided voltage (V2) being greater than the reference voltage (Ref2), the control signal (Ctrl2) turns OFF Thus, the control signal may be provided based on whether to supply a bias current to the bias control unit 239a.

The over voltage obtaining unit 830 may monitor the battery voltage (Vbat), and distinguish a state in which the battery voltage (Vbat) increases to greater than a predetermined voltage. The over voltage obtaining unit 830 may include resistors (R5 and R6) and/or a comparator (C3) for monitoring the battery voltage (Vbat). The resistors (R5 and R6) may divide the battery voltage (Vbat), to provide a voltage based on Equation (3), as follows:

$$\left(V3 = \frac{R5}{R5 + R6} Vbat\right) \quad (3)$$

The comparator (C3) may compare the provided voltage (V3) and a reference voltage (Ref3). In response to the provided voltage (V3) being greater than the reference voltage (Ref3), the comparator (C3) may provide a control signal (Ctrl3) for preventing a bias current. The over voltage obtaining unit 830 may further include an inverter performing a logic 'NOT' additionally connected to an output stage of the comparator (C3). To provide the signal for preventing the bias current in response to the battery voltage (Vbat) from increasing to greater than 4V, the resistor (R5) may have a value of 100 ohms, and the resistor (R6) may have a value of 900 ohms, and the reference voltage (Ref1) may be 0.4 V. Then, the divided voltage (V3) provided by the resistors (R5 and R6) increases to 0.1 Vbat. In response to v3 increasing to greater than the reference voltage (Ref3) set to 0.4 V, the battery voltage (Vbat) increases to greater than 4 V, and the comparator (C3) obtaining this increased Vbat may provide the control signal (Ctrl3). In response to the divided voltage (V3) being greater than the reference voltage (Ref3), the control signal (Ctrl3) turns ON and in response to the divided voltage (V3) being less than the reference voltage (Ref3), the control signal (Ctrl3) turns OFF. Thus, the control signal may be provided based on whether to supply a bias current to the bias control unit 239a.

The control signals (Ctrl1, Ctrl2 and Ctrl3) provided by the above-mentioned under voltage obtaining units 810 and 820 and over voltage obtaining unit 830 may be combined into one control signal (Ctrl) by an OR gate 840. In response to at least one of the control signals (Ctrl1, Ctrl2 and Ctrl3) for preventing the bias current being turned ON by the under voltage obtaining units 810 and 820 and the over voltage obtaining unit 830, the voltage protection circuit 239c may turn ON the control signal (Ctrl) preventing the bias current by using the OR gate 840 and forward the same to the bias control unit 239a. The bias control unit 239a may receive the control signal (Ctrl), to stop the supply of the bias current to the PA 231 and/or DA.

In FIG. 8, it is illustrated that the voltage protection circuit 239c includes three obtaining units, but the disclosure is not limited to this, and the voltage protection circuit 239c may include one, two, four or more obtaining units as well.

Figure 9:
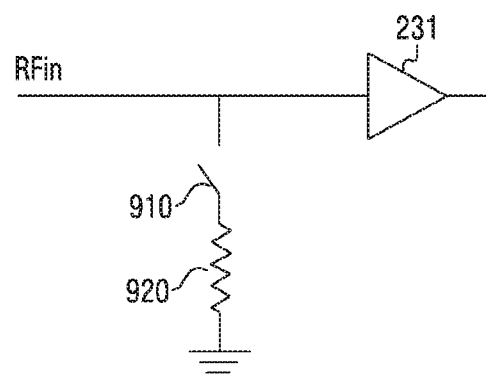
FIG. 9 illustrates a termination circuit of a PA input stage according to an embodiment.

FIG. 9 illustrates a termination circuit of an input stage of the PA 231 according to an embodiment.

In FIG. 9, the termination circuit may include a switch 910 and a termination resistor 920 and may be additionally connected to the input stage of the PA 231 to which an RF signal (RFin) is inputted.

In response to the PA 231 receiving a battery power source (Vbat) directly instead of via a PMIC, and a voltage via the PMIC being applied to the transceiver 220 providing an RF signal, although the battery power source (Vbat) is decreased instantaneously and thus the PA 231 turns OFF, the transceiver 220 may normally forward the RF signal to the PA 231. Thus, there is an increased possibility of burnout in the input stage of the PA 231 turned OFF.

To prevent burnout, the termination circuit illustrated in FIG. 9 may be added. In another example, the termination circuit may block a signal inputted to the PA 231 and prevent the existence of a signal amplified in and outputted from the PA 231. Accordingly, although the PA and the RF-FEM are not operated normally, the termination circuit may prevent a possibility of burnout by a reflected wave in the switch. The switch 910 of the termination circuit may be controlled by using a control signal (Ctrl) which is outputted from the OR gate 840 of the voltage protection circuit 239c and prevents a bias current to the bias control unit 239a. In response to the control signal (Ctrl) being enabled to provide the bias current, the switch 910 may turn OFF, and enable the RF signal (RFin) to be forwarded to the PA 231. However, in response to the control signal (Ctrl) preventing the bias current, the switch 910 may be turned ON, and enable the RF signal (RFin) to be terminated via the termination resistor 920 and not to be forwarded to the PA 231. Accordingly, the added termination circuit and the use/non-use of the termination circuit dependent on the control signal (Ctrl) of the voltage protection circuit 239c may prevent the burnout of the input stage of the PA 231.

Each of the comparators (C1, C2 and C3) of the voltage protection circuit 239c may use hysteresis for preventing or reducing the oscillation of the control signals (Ctrl1, Ctrl2 and Ctrl3) outputted from the comparators (C1, C2 and C3), which may be provided when a voltage intended to be obtained is unstable.

Figure 10A:
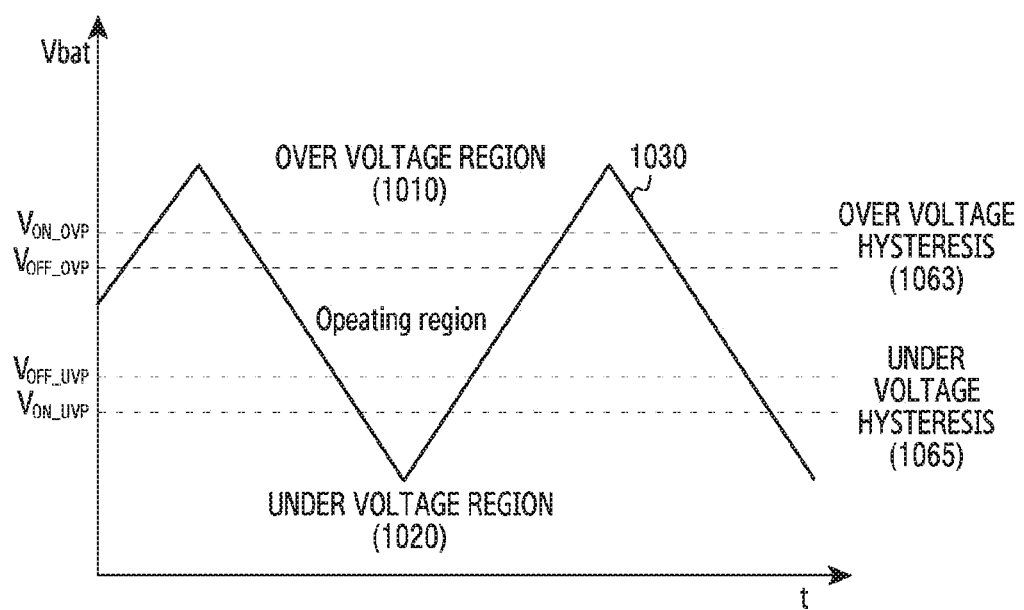
FIG. 10A and FIG. 10B illustrate an example of an over voltage region, an under voltage region and hysteresis according to embodiments.
Figure 10B:
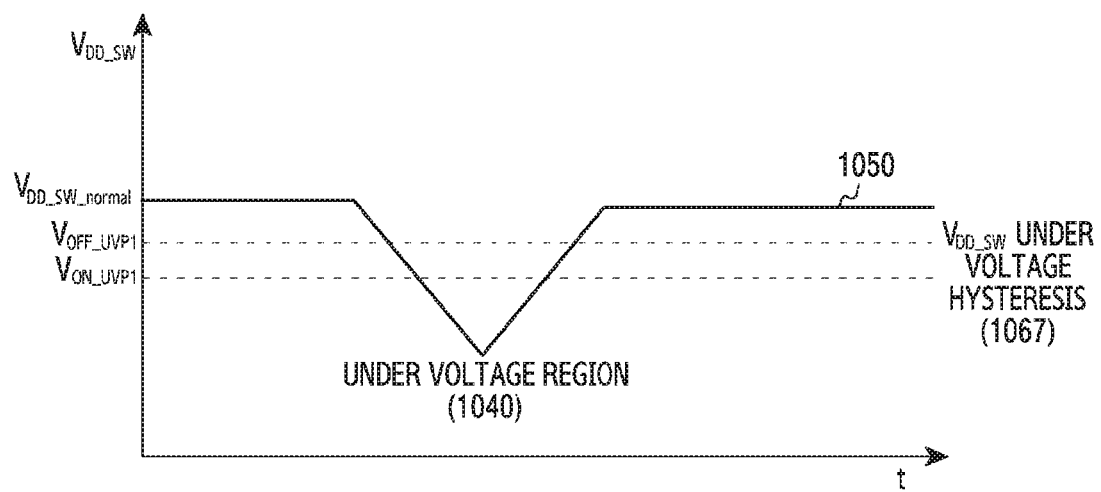

FIG. 10A and FIG. 10B illustrate an example of an over voltage region, an under voltage region and hysteresis according to embodiments.

Referring to FIG. 10A related to a battery voltage (Vbat), solid line 1030 refers to the battery voltage (Vbat). In response to the battery voltage (Vbat) entering the over voltage region 1010 or the under voltage region 1020, the voltage protection circuit 230c may turn ON the control signal (Ctrl) and control to prevent supply of a bias current to the PA 231.

Referring to FIG. 10A, in response to the battery voltage (Vbat) increasing to greater than $V_{ON\_OVP}$, the voltage protection circuit 239c may turn ON the control signal (Ctrl3), and control to prevent the supply of a bias current to the PA 231. In response to the battery voltage (Vbat) decreasing to less than $V_{OFF\_OVP}$, the voltage protection circuit 239c may turn OFF the control signal (Ctrl3), and control to supply a bias current to the PA 231. At this time, voltage ($V_{ON\_OVP}$) for turning ON the control signal (Ctrl3) is increased to greater than voltage ($V_{OFF\_OVP}$) for turning OFF the control signal (Ctrl3), thereby being capable of providing over voltage hysteresis 1063. This may reduce the danger of oscillating the control signal (Ctrl3).

In FIG. 10A, in response to the battery voltage (Vbat) decreasing to less than $V_{ON\_UVP}$, the voltage protection circuit 239c may turn ON the control signal (Ctrl1), and control not to supply a bias current to the PA 231. In response to the battery voltage (Vbat) increasing to greater than $V_{OFF\_UVP}$, the voltage protection circuit 239c may turn OFF the control signal (Ctrl1), and control to supply a bias current to the PA 231. At this time, voltage ($V_{ON\_UVP}$) for turning ON the control signal (Ctrl1) is decreased to less than voltage ($V_{OFF\_UVP}$) for turning OFF the control signal (Ctrl1), thereby being capable of providing under voltage hysteresis 1065. This may reduce the danger of oscillating the control signal (Ctrl1).

Referring to FIG. 10B related to a driving voltage ($V_{DD\_SW}$) of the buffer 310 controlling the switch 235, solid line 1050 refers to the driving voltage ($V_{DD\_SW}$). The driving voltage ($V_{DD\_SW}$) is generally provided by using the battery voltage (Vbat) via a regulator and thus, the driving voltage ($V_{DD\_SW}$) does not enter an over voltage region. In response to the battery voltage (Vbat) being equal to or greater than a predetermined value, a normal voltage ($V_{DD\_SW\_normal}$) is provided, but in response to the battery voltage (Vbat) decreasing to a predetermined value or less, there is a possibility in which an under voltage is provided. Accordingly, in response to the driving voltage ($V_{DD\_SW}$) entering an under voltage region 1040, the voltage protection circuit 230c may turn ON the control signal (Ctrl), and control to prevent supply of a bias current to the PA 231.

Referring to FIG. 10B, in response to the driving voltage ($V_{DD\_SW}$) of the buffer 310 controlling the switch 235 decreasing to less than $V_{ON\_UVP1}$, the voltage protection circuit 239c may turn ON the control signal (Ctrl2), and control to prevent supply of a bias current to the PA 231. In response to the driving voltage ($V_{DD\_SW}$) increasing to greater than $V_{OFF\_UVP}$, the voltage protection circuit 239c may turn OFF the control signal (Ctrl2), and control to supply a bias current to the PA 231. At this time, voltage ($V_{ON\_UVP}$) for turning ON the control signal (Ctrl2) is decreased to less than voltage ($V_{OFF\_UVP}$) for turning OFF the control signal (Ctrl2), thereby being capable of providing under voltage hysteresis 1067. This may reduce the danger of oscillating the control signal (Ctrl2).

Each of the comparator (C1, C2 or C3) of the obtaining units 810, 820 and 830 of the voltage protection circuit 239c may have hysteresis. Each of the comparators (C1 and C2) of the under voltage obtaining units 810 and 820 may use a voltage (e.g., 1.01× reference voltage) higher at a predetermined rate than inputted reference voltages based on the reference voltages (Ref1 and Ref2), in order to provide an OFF control signal, and may use a voltage (e.g., 0.99× reference voltage) lower at a predetermined rate than the reference voltages, in order to provide an ON control signal. Alternatively, the comparator (C3) of the over voltage obtaining unit 830 may use a voltage (e.g., 0.99× reference voltage) lower at a predetermined rate than an inputted reference voltage based on the reference voltage (Ref3), in order to provide an OFF control signal, and may use a voltage (e.g., 1.01× reference voltage) higher at a predetermined rate than the reference voltage, in order to provide an ON control signal.

The voltage protection circuit of embodiments herein may prevent the burnout of the PA 231 resulting from an ON/OFF sequence of the PA 231 and switch 235 of the RF-FEM 230 at battery voltage abnormality.

The aforementioned description has been made based on a time division duplex (TDD) RF-FEM shown in FIGS. 2A, 2B, 2C and 2D, may be applied to other RF-FEMs used together with a PA and a switch.

The embodiment of FIG. 8 illustrates controlling a bias current of one PA/DA but, in another or more embodiments, a plurality of PAs/DAs may be included in the RF-FEM.

Figure 11A:
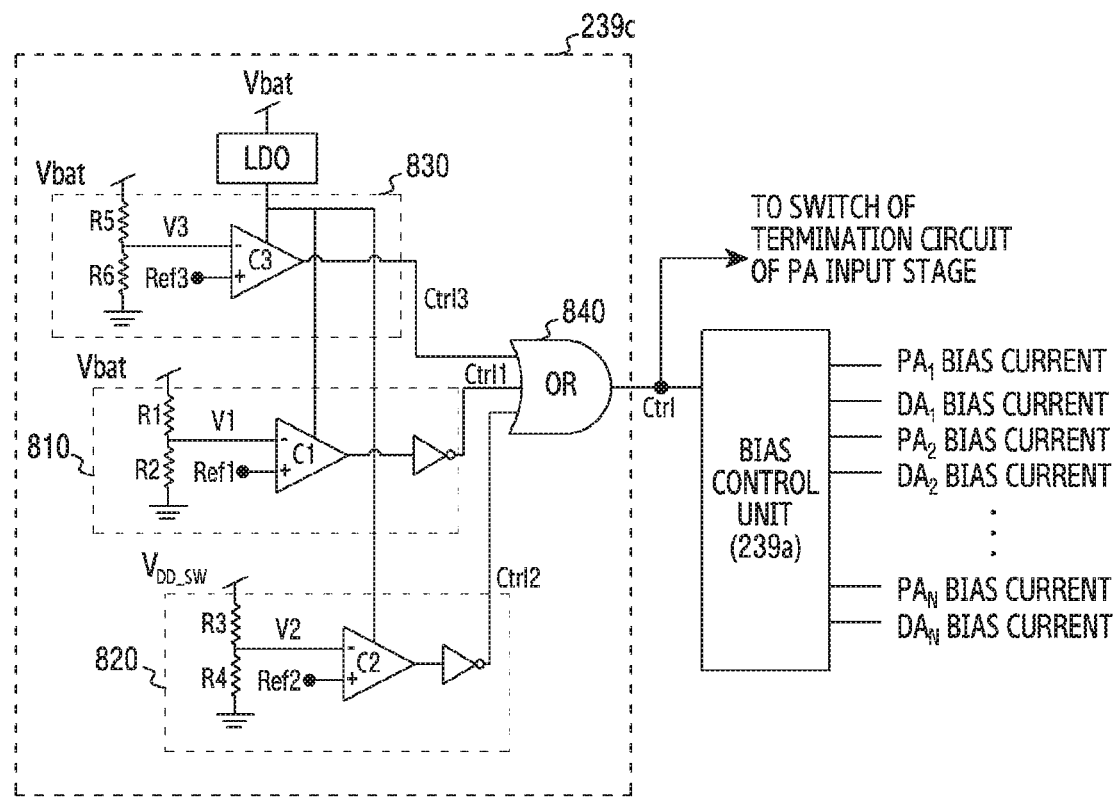
FIG. 11A and FIG. 11B illustrate a voltage protection circuit and a bias control unit in an RF-FEM including a plurality of PAs and DAs according to an embodiment.
Figure 11B:
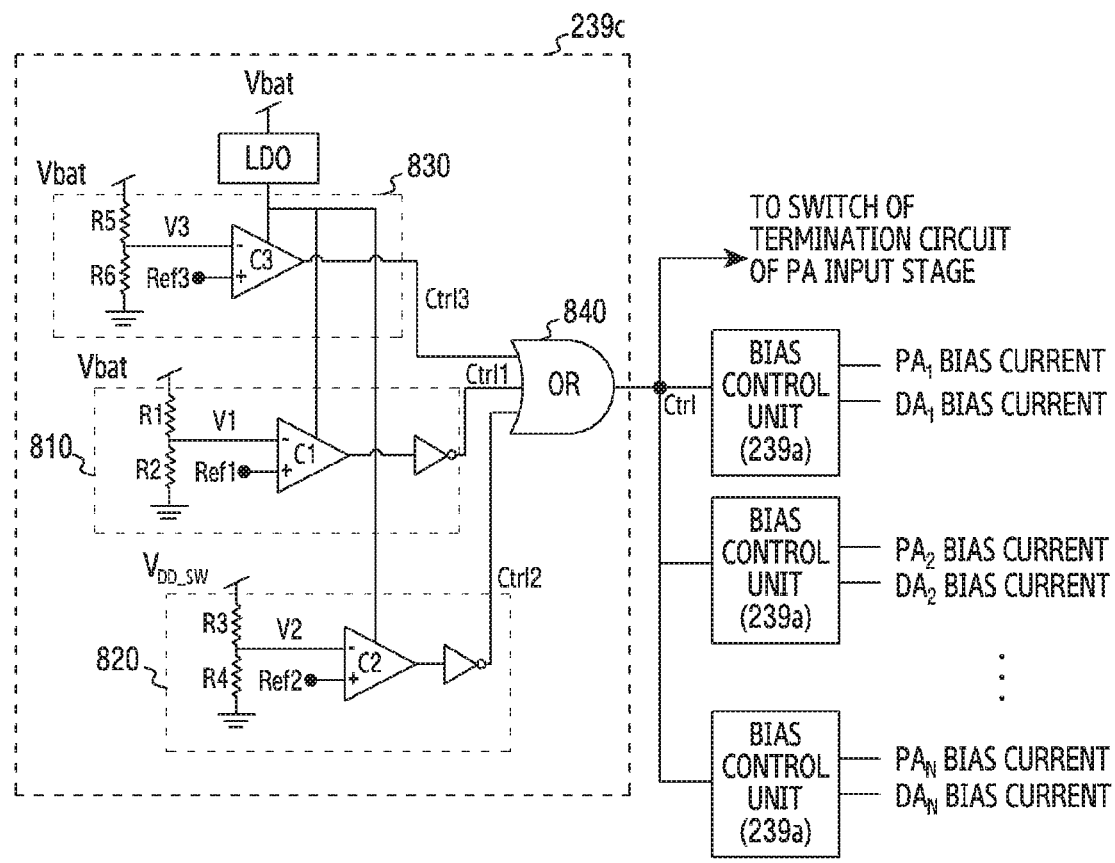

FIG. 11A and FIG. 11B illustrate the voltage protection circuit 239c and the bias control unit 239A in an RF-FEM including a plurality of PAs/DAs according to embodiments.

In FIG. 11A, one bias control unit 239a may supply a bias current to the plurality of PAs/DAs and simultaneously perform the bias current supply to the plurality of PAs/DAs according to a control signal (Ctrl) provided by the voltage protection circuit 239c, to prevent the burnout of the plurality of PAs/DAs.

In FIG. 11B, a plurality of bias control units 239a supplying a bias current to a plurality of PAs/DAs (PA$_1$, PA$_2$, PA$_N$, DA$_1$, DA$_2$, DA$_N$) respectively may be provided. A control signal (Ctrl) outputted from the voltage protection circuit 239c is forwarded to each of the plurality of bias control units 239a and, based on the received control signal (Ctrl), each of the bias control units 239a supplies or does not supply a bias current to the corresponding PA/DA, thereby being capable of preventing burnout of the PA/DA.

The voltage protection circuit 239c may also be applied to an RF-FEM supporting 5G mmWave beamforming.

Figure 12:
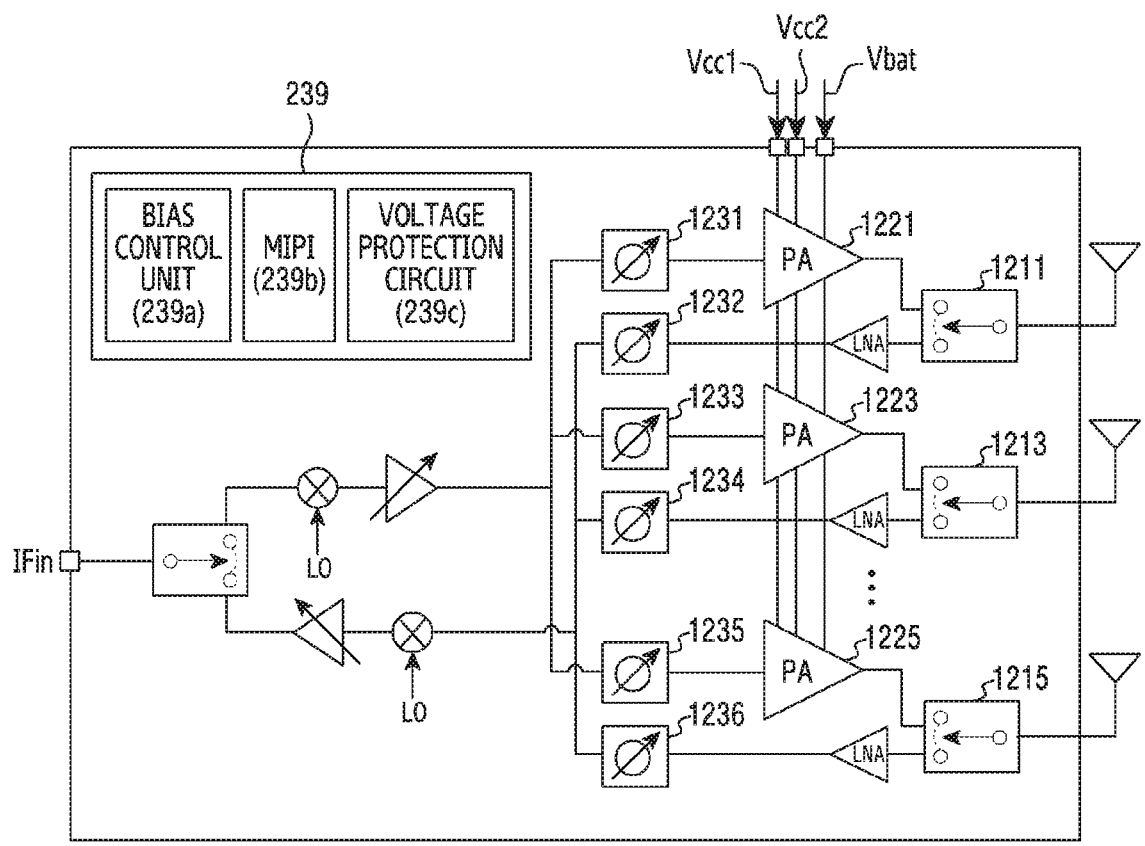
FIG. 12 illustrates an RF-FEM including a voltage protection circuit and supporting 5G millimeter wave (mmWave) beamforming according to an embodiment.

FIG. 12 illustrates an RF-FEM including a voltage protection circuit and supporting 5G mmWave beamforming according to an embodiment.

Referring to FIG. 12, for the sake of beamforming, the RF-FEM supporting the 5G mmWave beamforming includes a plurality of phase converters 1231 to 1236, or a plurality of PAs 1221, 1223 and 1225. A single driving power source (Vcc) and a battery power source (Vbat) may be shared to the plurality of PAs 1221, 1223 and 1225. In another example, a TDD operation is performed at mmWave and thus, switches 1211, 1213 and 1215 may be connected to output stages of the plurality of PAs 1221, 1223 and 1225 in implementation of a transmission path and a reception path. In this structure, a decrease of the battery voltage (Vbat) may occur, and there may be a possibility of PA burnout in response to a PA and switch ON/OFF sequence not being suitable. To solve the PA burnout possibility, the above-mentioned voltage protection circuit 239c may be applied. In this case, operation voltages of a PA of 6 GHz or less and a PA of mmWave may be different, so the voltage protection circuit 239c may further include a separate additional obtaining unit having a different reference voltage.

Even the RF-FEM including a 5G mmWave beamforming transmission module may use the voltage protection circuit 239c illustrated in FIG. 8, FIG. 11A and FIG. 11B. The outputted control signal (Ctrl) is forwarded to the bias control unit 239a supplying a bias current to the respective PAs, and simultaneously controls the bias current supply to all the PAs. In this case, the number of under voltage obtaining units and/or over voltage obtaining units included in the voltage protection circuit 239c may be greater than or less than the above-mentioned example. Alternatively, resistance values or reference voltages used in the respective obtaining units may be mutually different.

Figure 13:
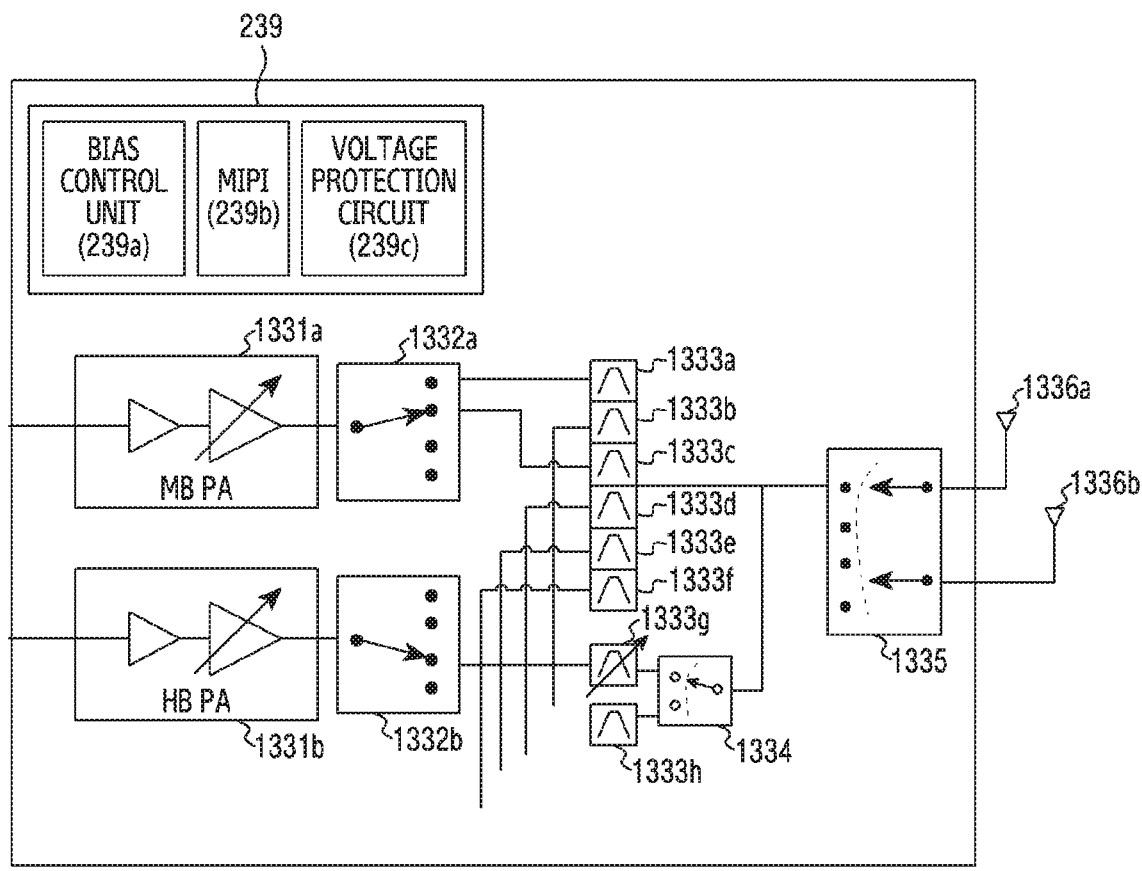
FIG. 13 illustrates an RF-FEM including a voltage protection circuit and supporting a plurality of bands in an electronic device according to an embodiment.

FIG. 13 illustrates an RF-FEM including the voltage protection circuit 239c and supporting a plurality of bands in the electronic device 101 according to an embodiment.

Referring to FIG. 13, the RF-FEM 230 may include a middle band (MB) PA 1331a, a high band (HB) PA 1331b, a plurality of filters 1333a to 1333h, an MB switch 1332a and an HB switch 1332b, a filter switch 1334 and an antenna switch 1335. The MB PA 1331A may amplify a middle band RF signal. The HB PA 1331b may amplify a high frequency band RF signal. The MB switch 1332a and the HB switch 1332b may connect a middle band RF signal and a high frequency band RF signal with one of the plurality of filters 1333a to 1333h. The filter switch 1334 may connect one of the filters 1333g and 1333h with an antenna switch 1335. The antenna switch 1335 may connect a filtered RF signal with at least one of a plurality of antennas 1336a and 1336b.

The RF-FEM 230 for supporting the plurality of bands exemplified in FIG. 13 includes the plurality of PAs 1331a and 1331b and the plurality of switches 1332a, 1332b, 1334 and 1335. At least one of the plurality of switches 1332a, 1332b, 1334 and 1335 is connected to an output stage of the PA 1331a or 1331b and thus an output signal of the PA 1331a or 1331b is reflected from at least one of the plurality of switches 1332a, 1332b, 1334 and 1335. This increases a possibility in which the PA may burn out. Accordingly, the voltage protection circuit 239c herein is used to control and first turn OFF the PA earlier than the plurality of switches, thereby being capable of preventing the PA burnout. In this case, in response to voltages supplied to buffers controlling the plurality of switches being mutually different, the voltage protection circuit 239c may include an under voltage obtaining unit for each voltage, and control a bias current supplied to the plurality of PAs 1331a and 1331b.

Figure 14:
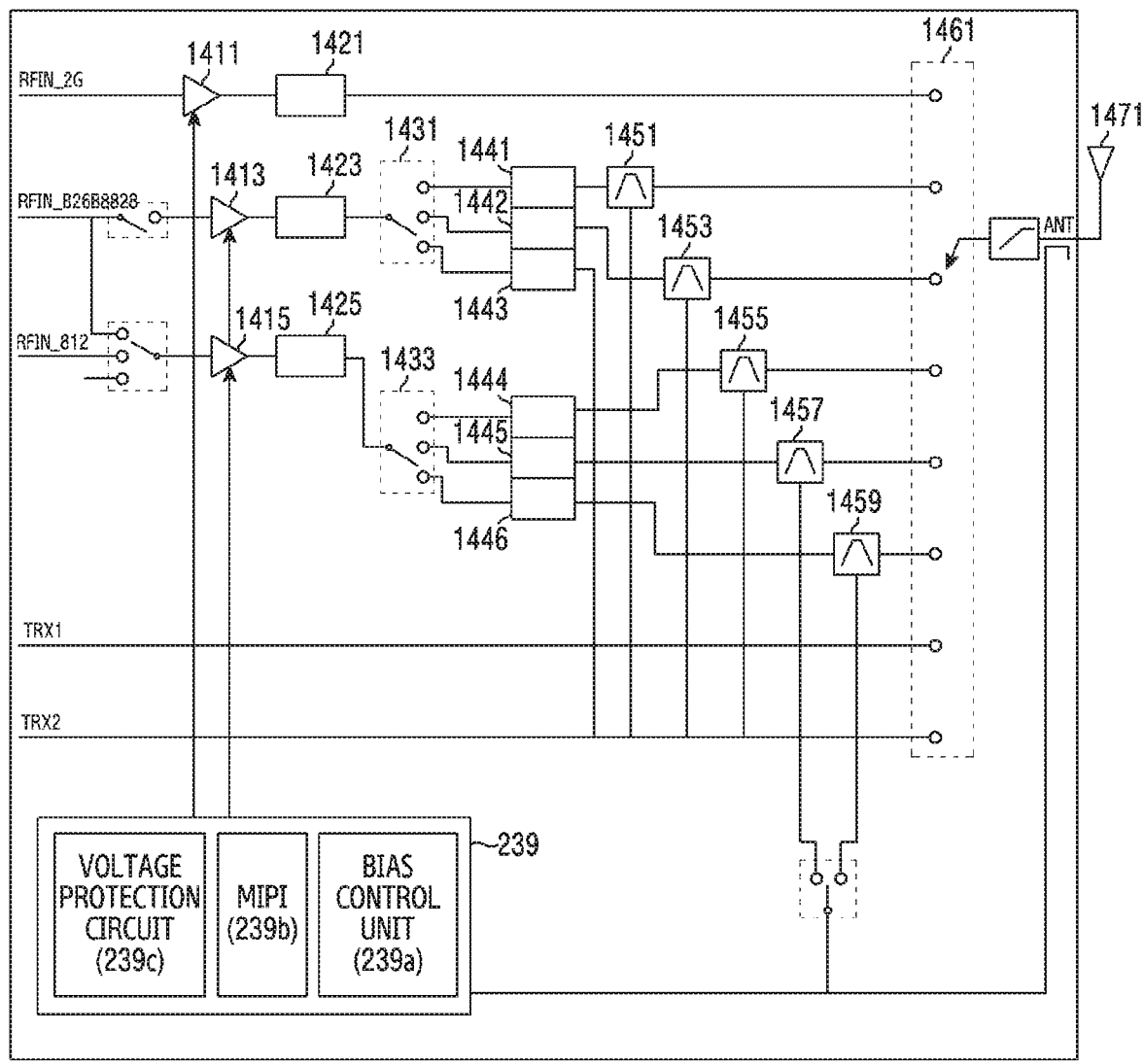
FIG. 14 illustrates an RF-FEM including a voltage protection circuit and supporting a plurality of bands in an electronic device according to an embodiment.

FIG. 14 illustrates an RF-FEM including a voltage protection circuit and supporting a plurality of bands in an electronic device according to an embodiment.

Referring to FIG. 14, the RF-FEM 230 may include PAs 1411, 1413 and 1415, matching circuits 1421, 1423 and 1425, switches 1431 and 1433, additional matching circuits 1411 to 1446, a plurality of duplexers or filters 1451, 1453, 1455, 1457 and 1459, and a switch 1461. The PAs 1411, 1413 and 1415 may amplify at least one RF input signal. The matching circuits 1421, 1423 and 1425 may be connected to output stages of the PAs 1411, 1413 and 1415. The switches 1431 and 1433 may be connected with the matching circuits 1421, 1423 and 1425. The plurality of duplexers or filters 1451, 1453, 1455, 1457 and 1459 may filter to transmit only an RF signal of a required band. The switch 1461 may select one of RF signals processed by at least one of the plurality of duplexers or filters 1451, 1453, 1455, 1457 and 1459. The RF signal selected by the switch 1461 may be radiated through an antenna 1471 after passing through another filter.

The RF-FEM 230 for supporting the plurality of bands in FIG. 14 includes the plurality of PAs 1411, 1413 and 1415 and the plurality of switches 1431, 1433 and 1461. At least one of the plurality of switches 1431, 1433 and 1461 is connected to output stages of the PAs 1411, 1413 and 1415 and thus, an output signal of the PA 1411, 1413 or 1415 is reflected from at least one of the plurality of switches 1431, 1433 and 1461, increasing a possibility in which the PA burns out. Accordingly, the voltage protection circuit 239c of the disclosure is used to control to first turn OFF the PA earlier than the plurality of switches, thereby being capable of preventing the PA burnout. For example, in response to voltages supplied to buffers controlling the plurality of switches 1431, 1433 and 1461 being mutually different, the voltage protection circuit 239c may include an under voltage obtaining unit for each voltage, and control a bias current supplied to the plurality of PAs 1411, 1413 and 1415.

According to an embodiment, an electronic device may include a PA configured to amplify a transmission signal, and a switch configured to set a path of a signal outputted from the PA, and a bias control circuit configured to control the supply of a bias current driving the PA, and a voltage protection circuit configured to provide a main control signal for turning OFF the PA earlier than the switch in response to abnormality occurring in a battery voltage providing a driving power of the electronic device, and forward the main control signal to the bias control unit. In response to receiving the main control signal instructing to turn OFF the PA from the voltage protection circuit, the bias control unit may stop the supply of the bias current driving the PA.

The electronic device may further include a matching circuit configured to connect with an output stage of the PA, and form a load impedance, and a filter configured to filter a signal of a selected band on a path of the transmission circuit.

The electronic device may further include a buffer buffering a signal controlling the switch and forwarding the signal to the switch. In response to a driving voltage of the buffer falls to a set value or less, the switch may be turned OFF.

The voltage protection circuit may include at least one obtaining unit comparing a voltage intended to be obtained with a reference voltage and obtaining whether the voltage intended to be obtained is an under voltage or an over voltage, and providing a control signal based on the obtaining result, and an OR gate providing the main control signal instructing to turn OFF the PA based on the control signal provided by the at least one obtaining unit.

The at least one obtaining unit may include two resistors dividing the voltage intended to be obtained, and a comparator comparing the voltage divided by the two resistors with a set reference voltage and providing the control signal.

The comparator may compare a voltage of a first rate of the set reference voltage and the divided voltage in order to turn ON the control signal, and compare a voltage of a second rate of the set reference voltage and the divided voltage in order to turn OFF the control signal. The comparator may include a hysteresis function in which the first rate and the second rate are set differently.

The at least one obtaining unit may include a first obtaining unit obtaining whether the battery voltage is an under voltage based on a first reference voltage, and providing a first control signal which has an ON value in response to the under voltage being obtained and which has an OFF value in response to the under voltage not being obtained, and a second obtaining unit obtaining whether a driving voltage of the buffer is an under voltage based on a second reference voltage, and providing a second control signal which has an ON value in response to the under voltage being obtained, and which has an OFF value in response to the under voltage not being obtained. The OR gate may provide the main control signal instructing to turn OFF the PA in response to at least one of the first control signal and the second control signal having the ON value.

The first reference voltage and the second reference voltage may be set wherein the under voltage may be obtained by the at least one obtaining unit before the driving voltage of the buffer falls to the set value or less.

The at least one obtaining unit may further include a third obtaining unit obtaining whether the battery voltage is an over voltage based on a third reference voltage, and providing a third control signal which has an ON value in response to the over voltage being obtained and which has an OFF value in response to the over voltage not being obtained. The OR gate may provide the main control signal instructing to turn OFF the PA in response to at least one of the first control signal, the second control signal and the third control signal having the ON value.

The electronic device may further comprise a termination circuit having a termination switch and a termination resistor connected in series. The termination circuit may be connected to an input stage of the PA in parallel, and change the termination switch into a closed position based on the main control signal instructing to turn OFF the PA, and terminate an RF signal inputted to the PA.

The electronic device may further comprise a low noise amplifier configured to amplify a received signal. The switch may connect the matching circuit and the filter for the sake of signal transmission according to time and connect the LNA and the filter for the sake of signal reception.

The electronic device may further comprise a plurality of PAs. The bias control unit may control the supply of a bias current to the plurality of PAs. In response to receiving the main control signal provided by the voltage protection circuit, the bias control unit may stop the supply of the bias current to the plurality of PAs.

The electronic device may further comprise a plurality of filters configured to filter signals of a plurality of specified bands, a plurality of PAs amplifying transmitted signals of mutually different bands, and a plurality of matching circuits corresponding to the plurality of PAs. The switch may be controlled to connect at least one of the plurality of matching circuits and at least one of the plurality of filters. The bias control unit may control the supply of a bias current to the plurality of PAs. In response to receiving the main control signal provided by the voltage protection circuit, the bias control unit may stop the supply of the bias current to the plurality of PAs.

According to an embodiment, an electronic device may include a plurality of antennas, and a first plurality of phase converters converting a phase of a transmitted signal for the sake of transmitted signal beamforming and a plurality of PAs amplifying the transmitted signal, and an LNA amplifying a received signal and a second plurality of phase converters converting a phase of a received signal, and a plurality of switches selectively connecting the plurality of PAs or the plurality of LNAs with the plurality of antennas, and a bias control unit controlling the supply of a bias current driving the PA, and a voltage protection circuit configured to provide a main control signal turning OFF the plurality of PAs earlier than the plurality of switches in response to abnormality occurring in a battery voltage providing a driving power of the electronic device, and forward the main control signal to the bias control unit. In response to receiving the main control signal instructing to turn OFF the plurality of PAs from the voltage protection circuit, the bias control unit may stop the supply of a bias current driving the plurality of PAs.

The electronic device may further comprise at least one buffer buffering a signal controlling the plurality of switches, and forwards the signal to the plurality of switches. In response to a driving voltage of the at least one buffer falls to a set value or less, the switch may be turned OFF.

The voltage protection circuit may comprise at least one obtaining unit comparing a voltage intended to be obtained with a reference voltage and obtaining whether the voltage intended to be obtained is an under voltage or an over voltage, and providing a control signal based on the obtaining result, and an OR gate providing the main control signal instructing to turn OFF the plurality of PAs based on the control signal provided by the at least one obtaining unit.

The at least one obtaining unit may each comprise two resistors dividing the voltage intended to be obtained, and a comparator comparing the voltage divided by the two resistors with a set reference voltage, and providing the control signal.

The comparator may compare a voltage of a first rate of the set reference voltage and the divided voltage in order to turn ON the control signal, and compare a voltage of a second rate of the set reference voltage and the divided voltage in order to turn OFF the control signal. The comparator may comprise a hysteresis function in which the first rate and the second rate are set differently.

The at least one obtaining unit may comprise a first obtaining unit determining whether the battery voltage is an under voltage based on a first reference voltage, and providing a first control signal which has an ON value in response to the under voltage being obtained and which has an OFF value in response to the under voltage not being obtained, and a second obtaining unit determining whether a driving voltage of the buffer is an under voltage based on a second reference voltage, and providing a second control signal which has an ON value in response to the under voltage being obtained and which has an OFF value in response to the under voltage not being obtained. The OR gate may provide the main control signal instructing to turn OFF the PA in response to at least one of the first control signal and the second control signal having the ON value.

The electronic device may further comprise a plurality of termination circuits each having a termination switch and a termination resistor connected in series. Each of the plurality of termination circuits may be connected to input stages of the plurality of PAs in parallel, and change the termination switch of each of the plurality of termination circuits into a closed position based on the main control signal instructing to turn OFF the plurality of PAs, and terminate a plurality of RF signals inputted to the plurality of PAs.

As used herein, the term "module" may include a unit implemented in hardware, software, or firmware, and may interchangeably be used with other terms, such as "logic," "logic block," "part," or "circuitry". A module may be a single integral component, or a minimum unit or part thereof, adapted to perform one or more functions. For example, the module may be implemented in a form of an application-specific integrated circuit (ASIC).

Embodiments as set forth herein may be implemented as software including one or more instructions that are stored in a storage medium that is readable by a machine. For example, a processor of the machine may invoke at least one of the one or more instructions stored in the storage medium, and execute the instructions, with or without using one or more other components under the control of the processor. This enables the machine to be operated to perform at least one function according to the at least one instruction invoked. The one or more instructions may include a code generated by a complier or a code executable by an interpreter. The machine-readable storage medium may be provided in the form of a non-transitory storage medium, in which "non-transitory" indicates that the storage medium is a tangible device, and does not include a signal but this term does not differentiate between where data is semi-permanently or temporarily stored in the storage medium.

A method according to embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be performed sequentially, in parallel, repeatedly, or heuristically, or one or more of the operations may be executed in a different order or omitted, or one or more other operations may be added.

While the disclosure has been particularly shown and described with reference to embodiments thereof, it will be understood by those skilled in the art that various changes in form and details may be made therein without departing from the scope of the subject matter as defined by the appended claims and their equivalents.

What is claimed is:

1. An electronic device comprising:
a power amplifier (PA) configured to amplify a transmission signal;
a switch configured to set a path of a signal outputted from the PA;
a bias control circuit configured to control the supply of a bias current driving the PA; and
a voltage protection circuit configured to provide a main control signal for turning off the PA earlier than turning off the switch based on a battery voltage providing a driving power of the electronic device, and forward the main control signal to the bias control circuit,
wherein, in response to receiving the main control signal instructing to turn off the PA from the voltage protection circuit, the bias control unit stops the supply of the bias current driving the PA.

2. The electronic device of claim 1, further comprising:
a matching circuit configured to connect with an output stage of the PA, and form a load impedance; and
a filter configured to filter a signal of a selected band on a path of the transmission circuit.

3. The electronic device of claim 2, further comprising a low noise amplifier (LNA) configured to amplify a received signal,
wherein the switch connects the matching circuit and the filter for signal transmission according to time and connects the LNA and the filter for signal reception.

4. The electronic device of claim 1, further comprising a buffer configured to buffer a signal controlling the switch, and to forward the signal to the switch,
wherein the switch is turned off in response to a driving voltage of the buffer decreasing to less than or equal to a set value.

5. The electronic device of claim 4, wherein the voltage protection circuit comprises:
at least one obtaining unit configured to compare a set voltage being sought with a reference voltage, determine whether the voltage being sought is an under voltage or an over voltage, and provide a control signal based on the obtaining result; and
an OR gate configured to provide the main control signal instructing to turn off the PA based on the control signal provided by the at least one obtaining unit.

6. The electronic device of claim 5, wherein the at least one obtaining unit comprises:
two resistors configured to divide the voltage being sought; and a comparator configured to compare the voltage divided by the two resistors with a set reference voltage and to provide the control signal to prevent the bias current.

7. The electronic device of claim 6, wherein the comparator is further configured to:
compare a voltage of a first rate of the set reference voltage and the divided voltage and turn on the control signal, and
compare a voltage of a second rate of the set reference voltage and the divided voltage and turn off the control signal, and
wherein the comparator comprises a hysteresis function in which the first rate and the second rate are set differently.

8. The electronic device of claim 5, wherein the at least one obtaining unit comprises:
a first obtaining unit configured to determine whether the battery voltage is an under voltage based on a first reference voltage, and to provide a first control signal which has an on value in response to the under voltage being obtained and which has an off value in response to the under voltage not being obtained; and
a second obtaining unit configured to determine whether a driving voltage of the buffer is an under voltage based on a second reference voltage, and to provide a second control signal which has an on value in response to the under voltage being obtained, and which has an off value in response to the under voltage not being obtained, and
wherein the OR gate is configured to provide the main control signal instructing to turn off the PA in response to at least one of the first control signal and the second control signal having the on value.

9. The electronic device of claim 8, wherein the first reference voltage and the second reference voltage are set such that the under voltage is obtained by the at least one obtaining unit before the driving voltage of the buffer decreases to less than or equal to the set value.

10. The electronic device of claim 8, wherein the at least one obtaining unit further comprises a third obtaining unit configured to determine whether the battery voltage is an over voltage based on a third reference voltage, and to provide a third control signal which has an on value in response to the over voltage being obtained and which has an off value in response to the over voltage not being obtained, and
wherein the OR gate is configured to provide the main control signal instructing to turn off the PA in response to at least one of the first control signal, the second control signal and the third control signal having the on value.

11. The electronic device of claim 1, further comprising a termination circuit having a termination switch and a termination resistor connected in series,
wherein the termination circuit is connected to an input stage of the PA in parallel, changes the termination switch into a closed position based on the main control signal instructing to turn off the PA, and terminates an RF signal inputted to the PA.

12. The electronic device of claim 1, further comprising a plurality of PAs, and
wherein the bias control circuit is further configured to:
control the supply of a bias current to the plurality of PAs, and
stop the supply of the bias current to the plurality of PAs in response to receiving the main control signal provided by the voltage protection circuit.

13. The electronic device of claim 1, further comprising:
a plurality of filters configured to filter signals of a plurality of specified bands;
a plurality of PAs configured to amplify transmitted signals of mutually different bands; and
a plurality of matching circuits corresponding to the plurality of PAs,
wherein the switch is controlled to connect at least one of the plurality of matching circuits to at least one of the plurality of filters,
wherein the bias control circuit:
controls the supply of a bias current to the plurality of PAs, and
stops the supply of the bias current to the plurality of PAs in response to receiving the main control signal provided by the voltage protection circuit.

14. An electronic device comprising:
a plurality of antennas;
a first plurality of phase converters configured to convert a phase of a transmitted signal for transmitted signal beamforming;
a plurality of power amplifiers (PAs) configured to amplify the transmitted signal;
a plurality of low noise amplifiers (LNAs) configured to amplify a received signal;
a second plurality of phase converters configured to convert a phase of a received signal;
a plurality of switches configured to selectively connect the plurality of PAs or the plurality of LNAs with the plurality of antennas;
a bias control circuit configured to control the supply of a bias current driving the PA; and
a voltage protection circuit configured to provide a main control signal turning off the plurality of PAs earlier than turning off the plurality of switches in response to abnormality occurring in a battery voltage providing a driving power of the electronic device, and to forward the main control signal to the bias control circuit,
wherein the bias control circuit stops the supply of a bias current driving the plurality of PAs in response to receiving the main control signal instructing to turn off the plurality of PAs from the voltage protection circuit.

15. The electronic device of claim 14, further comprising at least one buffer configured to buffer a signal controlling the plurality of switches and forward the signal to the plurality of switches,
wherein the switch is turned off in response to a driving voltage of the at least one buffer decreasing to less than or equal to a set value.

16. The electronic device of claim 15, wherein the voltage protection circuit comprises:
at least one obtaining unit configured to compare a voltage being sought with a reference voltage, to determine whether the voltage being sought is an under voltage or an over voltage, and to provide a control signal based on the obtaining result; and
an OR gate configured to provide the main control signal instructing to turn off the plurality of PAs based on the control signal provided by the at least one obtaining unit.

17. The electronic device of claim 16, wherein the at least one obtaining unit comprises:
two resistors configured to divide the voltage being sought; and
a comparator configured to compare the voltage divided by the two resistors with a set reference voltage, and to provide the control signal to prevent the bias current.

18. The electronic device of claim 17, wherein the comparator is further configured to:
compare a voltage of a first rate of the set reference voltage and the divided voltage and turn on the control signal, and
compare a voltage of a second rate of the set reference voltage and the divided voltage and turn off the control signal, and
wherein the comparator comprising a hysteresis function in which the first rate and the second rate are set differently.

19. The electronic device of claim 16, wherein the at least one obtaining unit comprises:
a first obtaining unit configured to determine whether the battery voltage is an under voltage based on a first reference voltage, and provide a first control signal which has an on value in response to the under voltage being obtained and which has an off value in response to the under voltage not being obtained; and
a second obtaining unit configured to determine whether a driving voltage of the buffer is an under voltage based on a second reference voltage, and provide a second control signal which has an on value in response to the under voltage being obtained and which has an off value in response to the under voltage not being obtained, and
wherein the OR gate provides the main control signal instructing to turn OFF the PA in response to at least one of the first control signal and the second control signal having the on value.

20. The electronic device of claim 14, further comprising a plurality of termination circuits having a termination switch and a termination resistor connected in series,
wherein each of the plurality of termination circuits is connected to input stages of the plurality of PAs in parallel, and
wherein the termination switch of each of the plurality of termination circuits is changed into a closed position based on the main control signal instructing to turn off the plurality of PAs, and terminates a plurality of RF signals inputted to the plurality of PAs.

* * * * *